United States Patent [19]

Ohta

[11] Patent Number: 5,682,114
[45] Date of Patent: Oct. 28, 1997

[54] VARIABLE DELAY CIRCUIT, RING OSCILLATOR, AND FLIP-FLOP CIRCUIT

[75] Inventor: Akira Ohta, Tokyo, Japan

[73] Assignee: Mitsubishi Denki Kabushiki Kaisha, Tokyo, Japan

[21] Appl. No.: 545,320

[22] Filed: Oct. 19, 1995

[30] Foreign Application Priority Data

Oct. 25, 1994 [JP] Japan ................... 6-260245

[51] Int. Cl.⁶ ............... H03K 5/13; H03K 7/08; H03K 17/28
[52] U.S. Cl. .............. 327/276; 327/263; 327/176; 327/164
[58] Field of Search ................... 327/261, 263, 327/264, 269, 270, 271, 272, 276, 277, 278, 281, 284, 285, 288, 172–176, 407–410, 99, 34–38, 164, 166, 291, 298; 326/104, 112, 119, 121, 122

[56] References Cited

U.S. PATENT DOCUMENTS

| | | | |
|---|---|---|---|
| 5,268,594 | 12/1993 | Huang | 327/261 |
| 5,336,938 | 8/1994 | Sywyk | 327/176 |
| 5,355,027 | 10/1994 | Shimada et al. | 307/247.1 |
| 5,389,828 | 2/1995 | Tago | 327/276 |
| 5,396,110 | 3/1995 | Houston | 327/263 |
| 5,459,422 | 10/1995 | Bechrin | 327/276 |
| 5,465,076 | 11/1995 | Yamauchi et al. | 331/57 |
| 5,495,197 | 2/1996 | Hayashi et al. | 327/276 |

FOREIGN PATENT DOCUMENTS

| | | | |
|---|---|---|---|
| 2-41017 | 2/1990 | Japan . | |
| 2119311 | 5/1990 | Japan | 327/278 |
| 3-64209 | 3/1991 | Japan | 327/261 |
| 3136519 | 6/1991 | Japan . | |
| 5268012 | 10/1993 | Japan . | |

OTHER PUBLICATIONS

Murakami et al, "A Digitally Programmable Delay Line And Duty Cycle Controller With Picosecond Resolution", IEEE Bipolar Circuits and Technology Meeting, 1991, pp. 218–221.

"A GaAs DCFL Variable Delay Circuit for 2.5 GHZ", 1991 Spring National Convention Record, The Institute of Electronics, Information and Communication Engineers.

Primary Examiner—Timothy P. Callahan
Assistant Examiner—Eunja Shin
Attorney, Agent, or Firm—Leydig, Voit & Mayer, Ltd.

[57] ABSTRACT

In a variable delay circuit for delaying an input signal by a variable delay time from a rising edge or a falling edge of the input signal to a rising edge or a falling edge of an output signal in a digital circuit, a data signal input terminal; a first signal input terminal to which a low-level signal of a logic gate is applied; n selector circuits (n=integer larger than 0) selecting either the signal at the data signal input terminal or the signal at the first signal input terminal in response to signals applied to first selector signal input terminals; and an (n+1)-input NOR circuit to which the signal at the data signal input terminal and output signals from the selector circuits are applied. In this variable delay circuit, a delay time shorter than the delay time of a single-stage buffer circuit can be controlled using only digital circuits.

16 Claims, 13 Drawing Sheets

VARIABLE DELAY CIRCUIT, RING OSCILLATOR, AND FLIP-FLOP CIRCUIT

FIELD OF THE INVENTION

The present invention relates to a variable delay circuit that can delay an input signal to a digital circuit by a variable delay time from a rising edge (a falling edge) of the input signal to a rising edge (a falling edge) of an output signal in response to control signal. The invention also relates to a ring oscillator and a flip-flop circuit employing the variable delay circuit.

BACKGROUND OF THE INVENTION

FIG. 28 is a block diagram illustrating an example of prior art variable delay circuits. In FIG. 28, reference character $I_1$ denotes a data signal input terminal, character $O_1$ denotes a data signal output terminal, characters $B_1$ to $B_{n-1}$ denote buffer circuits, and character SEL denotes an N:1 selector circuit.

A description is given of the operation.

The N:1 selector circuit SEL selects one of a signal at the data signal input terminal $I_1$ and signals at output terminals of the buffer circuits $B_1$ to $B_{n-1}$ in response to a control signal (not shown) and outputs the selected signal toward the data signal output terminal $O_1$.

When the signal at the data signal input terminal $I_1$ is selected by the N:1 selector circuit SEL, the delay time from the data input terminal $I_1$ to the data output terminal $O_1$ is equal to the delay time of the selector circuit SEL, i.e., $t_{SE}$.

Likewise, when the signal at the output terminal of the buffer circuit $B_i$ (i=integer, $1 \leq i \leq (n-1)$) is selected by the N:1 selector circuit SEL, the delay time from the data input terminal $I_1$ to the data output terminal $O_1$ is equal to the total of the delay time $t_{SE}$ of the selector circuit SEL and the delay times of the buffer circuits $B_1$ to $B_i$ ($i \times t_B$), that is, it is equal to $t_{SE}+(i \times t_B)$.

Using this variable delay circuit, the delay time can be varied from $t_{SE}$ to $t_{SE}+(n-1) \times t_B$ at the time interval of $t_B$. Since digital circuits can be employed for all constituent elements of this delay circuit, this delay circuit can be easily applied to digital circuits for various purposes. However, it is not possible to control the time interval to be shorter than the delay time $t_B$ of each buffer circuit.

FIG. 29 is a block diagram illustrating another example of prior art delay circuits.

In FIG. 29, the same reference characters as in FIG. 28 denote the same or corresponding parts. Reference characters $D_0$ to $D_n$ denote delay time control signal input terminals, character RG denotes a ramp waveform generator circuit, character DA denotes a digital/analog converter circuit, and character $C_1$ denotes a comparator circuit.

A description is given of the operation of the delay circuit.

In the digital/analog converter circuit DA, output voltages in response to the delay time control signals $D_0$ to $D_n$ are produced. When a data input signal is input to the ramp waveform generator circuit RG from the data input terminal $I_1$, a ramp waveform as shown in FIG. 30 is produced after a delay time $t_{RG}$. The comparator circuit $C_1$ outputs a signal to the data output terminal $O_1$ when a delay time $t_C$ has passed after the output voltage $N_{DA}$ at the output terminal of the digital/analog converter circuit DA becomes equal to the output voltage at the output terminal $N_{RG}$ of the ramp waveform generator circuit RG. Therefore, the delay time $t_R$ can be varied by controlling the output voltage $N_{DA}$, whereby the delay time of the circuit, i.e., $t_{RG}+t_R+t_C$, can be controlled.

In the prior art variable delay circuit shown in FIG. 29, the variation of the delay time is controlled by increasing the bit number of the delay time control signals $D_0-D_n$ of the digital/analog converter circuit DA, in other words, by increasing the accuracy of the digital/analog converter circuit DA. Therefore, the delay time can be controlled in a narrower time interval compared to the delay circuit shown in FIG. 28.

However, since the variable delay circuit includes an analog circuit, it is difficult to apply this delay circuit, as it is, to digital circuits for various purposes.

SUMMARY OF THE INVENTION

It is an object of the present invention to provide a variable delay circuit that can control a delay time shorter than a delay time of a single-stage buffer circuit, using a digital circuit.

It is another object of the present invention to provide a ring oscillator including the variable delay circuit according to the present invention, in which an oscillation frequency can be varied in response to a control signal.

It is still another object of the present invention to provide a clock synchronous flip-flop circuit that operates synchronously with clock signals, provided with a function of controlling the timing of data and a clock.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a variable delay circuit for delaying an input signal by a variable delay time from a rising edge or a falling edge of the input signal to a rising edge or a falling edge of an output signal in a digital circuit, comprises a data signal input terminal; a first signal input terminal to which a low-level signal of a logic gate is applied; n pieces of selector circuits (n=integer larger than 0) selecting either the signal at the data signal input terminal or the signal at the first signal input terminal in response to signals from first selector signal input terminals; and an (n+1)-input NOR circuit to which the signal at the data signal input terminal and output signals from the selector circuits are applied. Therefore, a delay time shorter than a delay time of a single-stage buffer circuit can be controlled using only digital circuits.

According to a second aspect of the present invention, the above-described variable delay circuit further comprises a second variable delay circuit connected to an output end of the (n+1)-input NOR circuit, and the second variable delay circuit comprises a second data signal input terminal to which an output signal from the first variable delay circuit is applied, a second signal input terminal to which a low-level signal of a logic gate is applied, m pieces of selector circuits (m=integer larger than 0) selecting either the signal at the second data signal input terminal or the signal at the second signal input terminal in response to signals from second selector signal input terminals, and an (m+1)-input NOR circuit to which an output signal from the first variable delay circuit and output signals from the selector circuits are applied. Therefore, a delay time shorter than the delay time of a single-stage buffer circuit can be controlled in a wider delay time variable range. In addition, the width of the data signal can be varied.

According to a third aspect of the present invention, the above-described variable delay circuit further comprises a delay element connected between the data signal input terminal and an input end of the (n+1)-input NOR circuit. Therefore, the timing of the signal input to the (n+1)-input NOR circuit can be adjusted, whereby a delay time shorter than the delay time of a single-stage buffer circuit can be controlled in a wider delay time variable range.

According to a fourth aspect of the present invention, a variable delay circuit for delaying an input signal by a variable delay time from a rising edge or a falling edge of the input signal to a rising edge or a falling edge of an output signal in a digital circuit, comprises a data signal input terminal; an inverter to which a signal at the data signal input terminal is applied; n pieces of two-input NOR selector circuit (n=integer larger than 0) to which the signal at the data signal input terminal and n pieces of select signals are applied; and an (n+1)-input NOR circuit to which an output signal from the inverter and output signals from the two-input NOR selector circuits are applied. Therefore, a delay time shorter than the delay time of a single-stage buffer circuit can be controlled by only digital circuits having a simple structure.

According to a fifth aspect of the present invention, in a variable delay circuit, any of the above-described variable delay circuits are connected in series. Therefore, a delay time shorter than the delay time of a single-stage buffer circuit can be controlled in a wider delay time variable range.

According to a sixth aspect of the present invention, a variable delay circuit for delaying an input signal by a variable delay time from a rising edge or a falling edge of the input signal to a rising edge or a falling edge of an output signal in a digital circuit, comprises a data signal input terminal; an inverter to which a signal at the data signal input terminal is applied; a first partial delay circuit receiving an output signal from the inverter as a first input signal and the signal at the data signal input terminal as a second input signal; a second partial delay circuit receiving an output signal from the first partial delay circuit as a first input signal and the output signal from the inverter as a second input signal; and an i-th partial delay circuit (i=integer not less than 3 and not larger than n) receiving an output signal from an (i−1)th partial delay circuit as a first input signal and an output signal from an (i−2)th partial delay circuit as a second input signal. The i-th partial delay circuit includes n pieces of two-input NOR selector circuits to which the second input signals and select signals are applied and an (n+1)-input NOR circuit to which the first input signals and output signals from the two-input NOR selector circuits are applied, and outputs an output signal from the (n+1)-input NOR circuit. Therefore, the power consumption is reduced in the variable delay circuit that controls a delay time shorter than the delay time of a single-stage buffer circuit in a wide delay time variable range.

According to a seventh aspect of the present invention, a variable delay circuit for delaying an input signal by a variable delay time from a rising edge or a falling edge of the input signal to a rising edge or a falling edge of the output signal in a digital circuit, comprises a digital/analog converter circuit to which n pieces of delay time control signals (n=integer not less than 1) are applied; an inverter to which a data input signal is applied; n pieces of two-input NOR selector circuits each having a first input to which the data input signal is applied and a second input to which an output signal from the digital/analog converter circuit is applied; and an (n+1)-input NOR circuit to which an output signal from the inverter and output signals from the two-input NOR selector circuits are applied. Therefore, the variable delay time interval is further reduced.

According to an eighth aspect of the present invention, the above-described variable delay circuit further comprises n pieces of selector circuits connected between an output end of the digital/analog converter circuit and the second inputs of the two-input NOR selector circuits, respectively; an input terminal to which a low-level signal of a logic gate is applied; and n pieces of select signal input terminals; and the selector circuits selecting either the output signal from the digital/analog converter circuit or the low-level signal in response to signals from the select signal input terminals, respectively. Therefore, the delay time is controlled in a wider delay time variable range.

According to a ninth aspect of the present invention, the above-described variable delay circuit further comprises a delay circuit connected between the data signal input terminal and the inverter. Therefore, a delay time shorter than the delay time of a single-stage buffer circuit can be controlled in a wider delay time variable range.

According to a tenth aspect of the present invention, the above-described variable delay circuit further comprises (n+1) pieces of transistors having different sizes and connected to input ends of the (n+1)-input NOR circuits. Therefore, various delay times can be controlled.

According to an eleventh aspect of the present invention, the above-described variable delay circuit further comprises a first power supply and a second power supply; a first resistor having a cuttable wiring part and connected between the first power supply and the select signal input terminal; and a second resistor having a cuttable wiring part and connected between the second power supply and the select signal input terminal. Therefore, performance of a semiconductor device that is varied by variations in the delay time is kept constant.

According to a twelfth aspect of the present invention, a variable delay circuit for delaying an input signal by a variable delay time from a rising edge or a falling edge of the input signal to a rising edge or a falling edge of an output signal in a digital circuit, comprises a variable delay circuit according to any of the above-described first to eleventh aspects, to which a data input signal is applied; (n−2) pieces of buffer circuits (n=integer not less than 3) connected in series, to which an output signal from the variable delay circuit is applied; and a selector circuit selecting one of the data input signal, the output signal from the variable delay circuit, and output signals from the buffer circuits. Therefore, a delay time longer than the delay time of a single-stage buffer circuit can be controlled.

According to a thirteenth aspect of the present invention, a variable delay circuit for delaying an input signal by a variable delay time from a rising edge or a falling edge of the input signal to a rising edge or a falling edge of an output signal in a digital circuit, comprises (n−1) pieces of variable delay circuits (n=integer not less than 2) according to any of the above-described first to twelfth aspects, connected in series and receiving a data input signal; and a selector circuit for selecting one of the data input signal and output signals from the variable delay circuits. Therefore, a delay time shorter than the delay time of a single-stage buffer circuit can be controlled in a wider delay time variable range.

According to a fourteenth aspect of the present invention, a ring oscillator comprising an odd number of inverters connected in a ring, and n pieces of variable delay circuits ($1 \leq n$) according to any of the above-described first to thirteenth aspects, wherein the variable delay circuits are connected in series and inserted in at least a position between the inverters. Therefore, the oscillation frequency can be varied in response to a control signal.

According to a fifteenth aspect of the present invention, in the above-described ring oscillator, each of the variable delay circuits includes an (n+2)-input NOR circuit to which a reset signal is applied. The phase of the ring oscillator can be controlled.

According to a sixteenth aspect of the present invention, a clock synchronous flip-flop circuit that operates synchronously with clock signals, comprises a variable delay circuit according to any of the above-described first to thirteenth aspects, to which a data input signal or a clock signal is applied; and a clock synchronous flip-flop receiving an output signal from the variable delay circuit as a data input or a clock input. Therefore, the timing of the data input and the clock input can be controlled, whereby the data are transmitted with high accuracy.

DETAILED DESCRIPTION OF THE PREFERRED EMBODIMENTS

[Embodiment 1]

Figure 1:
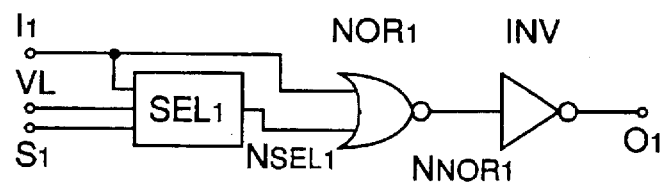
FIGS. 1(a)–1(b) are diagrams illustrating a variable delay circuit in accordance with a first embodiment of the present invention.
Figure 1:
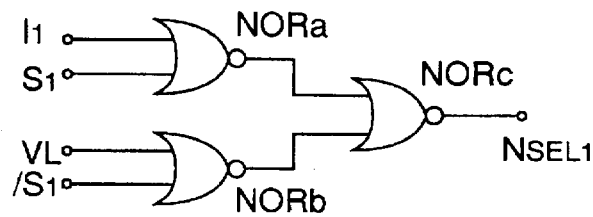

FIG. 1(a) shows a variable delay circuit in accordance with a first embodiment of the present invention.

In this first embodiment, a delay time from a rising edge (a falling edge) of an input signal to a rising edge (a falling edge) of an output signal in a digital circuit is varied in response to a control signal. The variable delay circuit comprises a data input terminal $I_1$, an L signal input terminal $V_L$ to which an L (low level) signal of a logic gate is applied, a selector circuit $SEL_1$ that selects one of signals from the terminals $I_1$ and $V_L$ in response to a delay time control signal $S_1$ and outputs the selected signal, a two-input NOR circuit $NOR_1$ which receives the signal from the data input terminal $I_1$ and the signal from the output terminal $N_{SEL1}$ of the selector circuit $SEL_1$ and produces a logical sum of the signals, and an inverter circuit INV which receives a signal from the output terminal $N_{NOR1}$ of the two-input NOR circuit $NOR_1$ and outputs the signal to the data output terminal $O_1$.

For the selector circuit $SEL_1$, a circuit shown in FIG. 1(b) can be employed. In FIG. 1(b), reference characters $NOR_a$, $NOR_b$, and $NOR_c$ denote two-input NOR circuits. The selector circuit $SEL_1$ can be realized by a combination of transfer gates. In this case, the delay time due to the selector circuit is reduced. In addition, these circuits are DCFL (Direct Coupled FET Logic) circuits.

Figure 2:
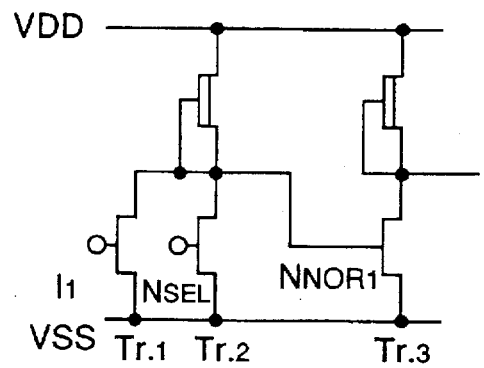
FIG. 2 is a diagram illustrating a two-input NOR circuit included in the delay circuit shown in FIG. 1(a).

FIG. 2 is a diagram showing the two-input NOR circuit NOR$_1$ shown in FIG. 1(a). In FIG. 2, reference characters Tr.1, Tr.2, and Tr.3 denote transistors, and reference character VDD and VSS denote supply voltages.

A description is given of the operation of the delay circuit according to the first embodiment of the invention.

Figure 3:
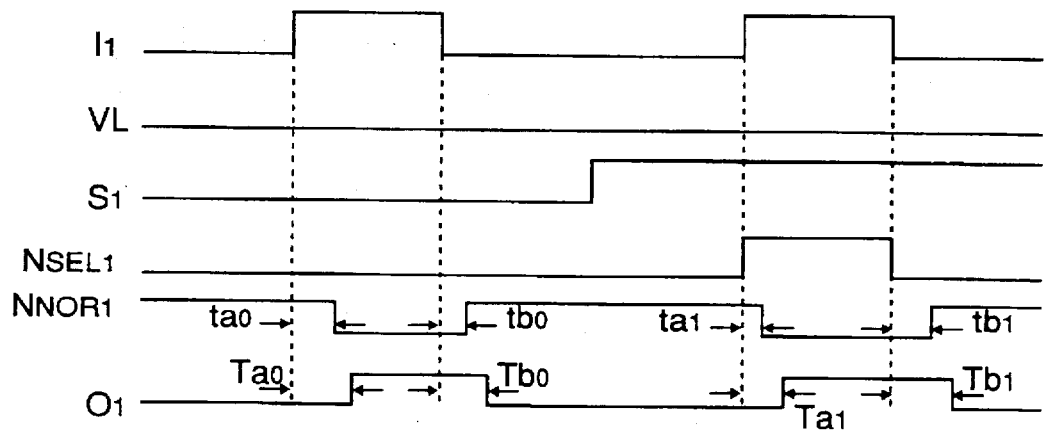
FIG. 3 is a timing chart of the variable delay circuit according to the first embodiment of the invention.

FIG. 3 is a timing chart of the variable delay circuit according to the first embodiment of the invention. The selector circuit SEL$_1$ selects a data input I$_1$ when the delay time control signal S$_1$ is high level (hereinafter referred to as "H") and selects a low-level input V$_L$ when the signal S$_1$ is low level (hereinafter referred to as "L"). The delay time of the selector circuit SEL$_1$ is ignored in the following description.

(1) When the input signal I$_1$ rises from "L" to "H":

[A] When the signal at the data input terminal I$_1$ is selected by the selector circuit SEL$_1$ in response to the delay time control signal S$_1$, in other words, when the delay time control signal S$_1$ is "H", the same signal, i.e., the signal at the data input terminal I$_1$, is applied to the two inputs of the two-input NOR circuit NOR$_1$. In this state, when the input signal rises, the signals at the data input terminal I$_1$ and the output terminal N$_{SEL1}$ of the selector circuit SEL$_1$ rise from "L" to "H", whereby electrical charge accumulated in the capacitance of the gate of the transistor Tr.3 is discharged to VSS through sources and drains of the transistors Tr.1 and Tr.2. The signal at the output terminal N$_{NOR1}$ of the two-input NOR circuit NOR$_1$ falls from "H" to "L" after the delay time $t_{a1}$, and the signal at the data output terminal O$_1$ rises from "L" to "H" after the delay time T$_{a1}$ that is the sum of the delay time $t_{a1}$ and the delay time of the inverter INV.

[B] When the signal at the low-level input terminal V$_L$ is selected by the selector circuit SEL$_1$ in response to the delay time control signal S$_1$, in other words, when the delay time control signal S$_1$ is "L", the signals at the data input terminal I$_1$ and the low-level input terminal V$_L$ are applied to the input terminals of the two-input NOR circuit NOR$_1$.

In this state, when the input signal rises, the signal at the data input terminal I$_1$ rises from "L" to "H", whereby the electrical charge accumulated in the capacitance of the gate of the transistor Tr.3 is discharged to VSS through the drain and the source of the transistor Tr.1. The signal at the output terminal N$_{NOR1}$ of the two-input NOR circuit NOR$_1$ falls from "H" to "L" after the delay time $t_{a0}$, and the signal at the data output terminal O$_1$ rises from "L" to "H" after the delay time T$_{a0}$ that is the sum of the delay time $t_{a0}$ and the delay time of the inverter INV.

When cases [A] and [B] are compared, in case [A], the discharge is carried out with two transistors whereas it is carried out with one transistor in case [B]. Therefore, the operating speed in case [A] is twice as high as that in case [B].

Accordingly, when the input signal rises, a shorter delay time is obtained by selecting the signal at the data input terminal I$_1$ with the selector circuit SEL1. The difference between T$_{a0}$ and T$_{a1}$, i.e., (T$_{a0}$–T$_{a1}$), is represented by ΔtL-H.

(2) When the input signal I$_1$ falls from "H" to "L":

[A] When the signal at the data input terminal I$_1$ is selected by the selector circuit SEL$_1$ in response to the delay time control signal S$_1$, in other words, when the delay time control signal S$_1$ is "H", the same signal, i.e., the signal at the data input terminal I$_1$, is applied to the two inputs of the two-input NOR circuit NOR$_1$. In this state, when the input signal falls, the signals at the data input terminal I$_1$ and the output terminal N$_{SEL1}$ of the selector circuit SEL$_1$ fall from "H" to "L", whereby gate to drain capacitance charge of the transistors Tr.1 and Tr.2 is accumulated in the capacitance of the gate of the transistor Tr.3. The signal at the output terminal N$_{NOR1}$ of the two-input NOR circuit NOR$_1$ rises from "L" to "H" after the delay time $t_{b1}$, and the signal at the data output terminal O$_1$ falls from "H" to "L" after the delay time T$_{b1}$ that is the sum of the delay time $t_{b1}$ and the delay time of the inverter INV.

[B] When the signal at the low-level input terminal V$_L$ is selected by the selector circuit SEL$_1$ in response to the delay time control signal S$_1$, in other words, when the delay time control signal S$_1$ is "L", the signals at the data input terminal I$_1$ and the low-level input terminal V$_L$ are applied to the input ends of the two-input NOR circuit NOR$_1$.

In this state, when the input signal falls, the signal at the data input terminal I$_1$ falls from "H" to "L", whereby the gate to drain capacitance charge of the transistor Tr.1 is accumulated in the capacitance of the gate of the transistor Tr.3. The signal at the output terminal N$_{NOR1}$ of the two-input NOR circuit NOR$_1$ rises from "L" to "H" after the delay time $t_{b0}$, and the signal at the data output terminal O$_1$ falls from "H" to "L" after the delay time T$_{b0}$ that is the sum of the delay time $t_{b0}$ and the delay time of the inverter INV.

When cases [A] and [B] are compared, since the charged capacitance is larger in case [A] than in case [B] by the gate to drain capacitance of one transistor, the delay time is longer in case [A] than in case [B]. Accordingly, when the input signal falls, a longer delay time is obtained by selecting the signal at the data input terminal I$_1$ with the selector circuit SEL$_1$. The difference between T$_{b1}$ and T$_{b0}$, i.e., (T$_{b1}$–T$_{b0}$), is represented by ΔtH→L.

In the variable delay circuit according to the first embodiment of the invention, the rise time can be varied in the range of ΔtL→H and the fall time can be varied in the range of ΔtH→L. These ΔtL→H and ΔtH→L are about ¼~⅕ of the delay time of the inverter (buffer). In addition, the constituent circuits of the variable delay circuit are digital circuits.

As a result, a variable delay circuit according to this first embodiment can control a delay time shorter than the delay time of a single-stage buffer circuit, using only digital circuits.

[Embodiment 2]

Figure 4:
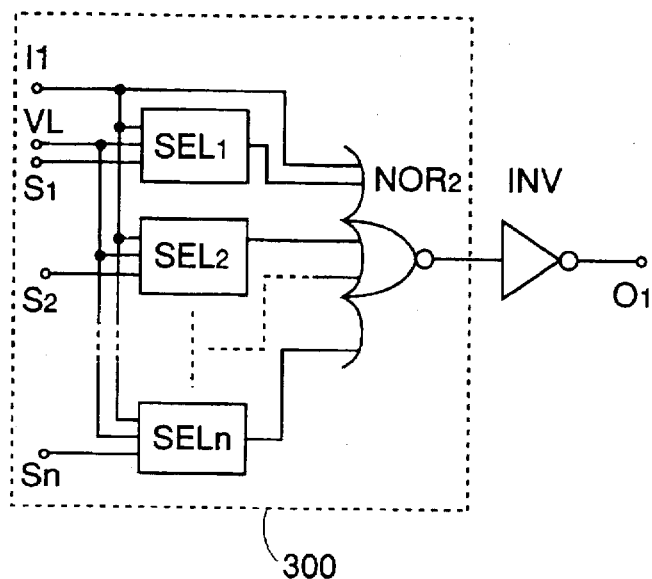
FIG. 4 is a diagram illustrating a variable delay circuit in accordance with a second embodiment of the present invention.

FIG. 4 is a diagram illustrating a variable delay circuit in accordance with a second embodiment of the present invention.

In this second embodiment, a delay time from a rising edge (falling edge) of an input signal to a rising edge (falling edge) of an output signal in a digital circuit is varied in response to a control signal. More specifically, the selector circuit SEL$_1$ according to the first embodiment that selects either the signal at the data input terminal I$_1$ or the L signal at the logic gate V$_L$ in response to the delay time control signal S$_1$ and outputs the selected signal is replaced with selector circuits SEL$_1$ to SEL$_n$ that select either the signal at the data input terminal I$_1$ or the signal at the low-level input terminal V$_L$ in response to delay time control signals S$_1$ to S$_n$, respectively. Hereinafter, the selector circuits SEL$_1$ to SEL$_n$ are referred to as SEL$_i$ (1≤i≤n), and the signals S$_1$ to S$_n$ are referred to as S$_i$, for simplification. Further, the two-input NOR circuit NOR$_1$ which receives the signal from the data input terminal I$_1$ and the signal from the output terminal N$_{SEL1}$ of the selector circuit SEL$_1$ and produces a logical sum of these signals is replaced with an (n+1)-input NOR circuit NOR$_2$ which receives the signal from the data input terminal I$_1$ and output signals from the selector circuits SEL$_i$ and produces a logical sum of these signals is employed.

A description is given of the operation of the variable delay circuit according to this second embodiment of the invention.

Figure 5:
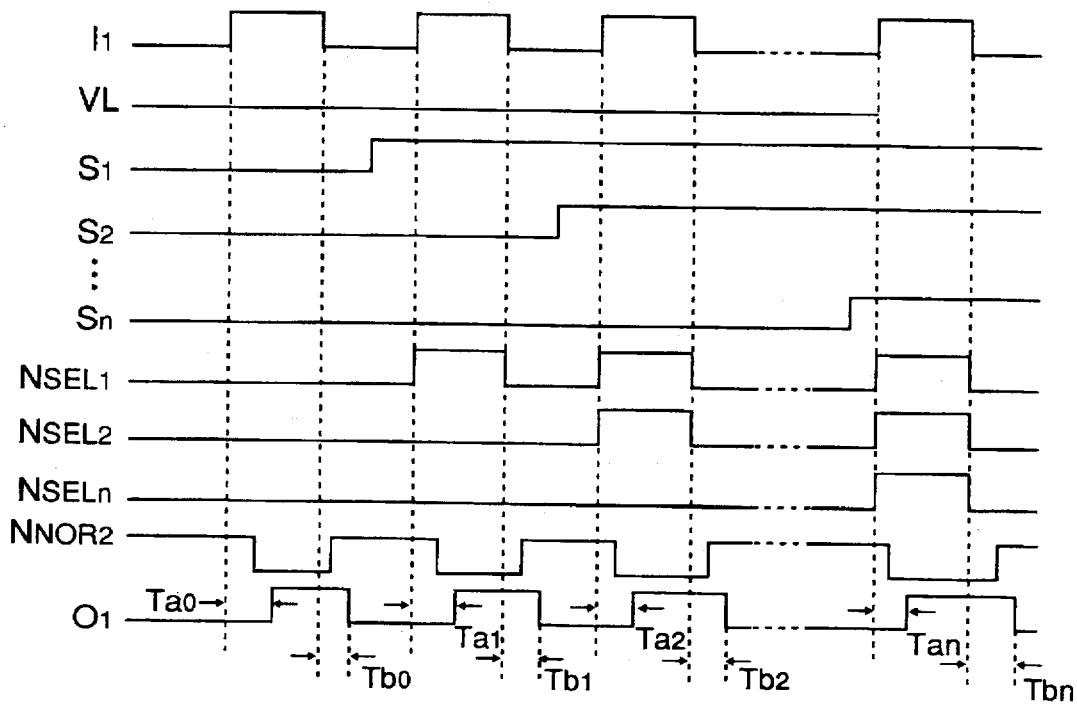
FIG. 5 is a timing chart of the variable delay circuit according to the second embodiment of the invention.

FIG. 5 is a timing chart of the variable delay circuit shown in FIG. 4. The selector circuits $SEL_i$ select the data input $I_1$ when the delay time control signals $S_i$ are "H" and select the low-level input $V_L$ when the control signals $S_i$ are "L", respectively. The delay time of the selector circuits is ignored.

Initially, a case where the signal at the data input terminal $I_1$ is applied to only one of the input terminals of the (n+1)-input NOR circuit $NOR_2$ while the signal at the low-level input terminal $V_L$ is applied to the other input terminals of the NOR circuit $NOR_2$ according to the delay time control signals $S_i$, in other words, a case where all of the selector circuits $SEL_i$ select the low-level input terminal $V_L$, will be described. In this case, it is assumed that the delay time from the input terminal $I_1$ to the output terminal $O_1$ when the signal at the input terminal $I_1$ of this variable delay circuit rises from "L" to "H" is $T_{ao}$, and the delay time from the input terminal $I_1$ to the output terminal $O_1$ when the signal at the input terminal $I_1$ falls from "H" to "L", is $T_{bo}$.

A description is given of the operation of the variable delay circuit when only k (k=integer, $1 \leq k \leq n$) selector circuits $SEL_i$ select the signal at the data input terminal $I_1$.

(1) When the signal at the data input terminal $I_1$ rises from "L" to "H":

As described in the first embodiment of the invention, when the signal at the data input terminal $I_1$ is input to the (n+1)-input NOR circuit $NOR_2$ from the k selector circuits $SEL_i$, the delay time is reduced by k×ΔtL→H. Therefore, the delay time $T_{ak}$ of the variable delay circuit is represented by $$T_{ak}=T_{ao}-(k \times \Delta tL \rightarrow H)$$

(2) When the signal at the data input terminal $I_1$ falls from "H" to "L":

As described for the first embodiment, when the signal at the data input terminal $I_1$ is input to the (n+1)-input NOR circuit $NOR_2$ from the k selector circuits $SEL_i$, the delay time is increased by k×ΔtH→L. In this case, the delay time $T_{bk}$ of the variable delay circuit is represented by $$T_{bk}=T_b+(k \times \Delta tH \rightarrow L)$$

In this way, according to this second embodiment of the present invention, a variable delay time range larger than that obtained in the first embodiment is realized.

[Embodiment 3]

Figure 6:
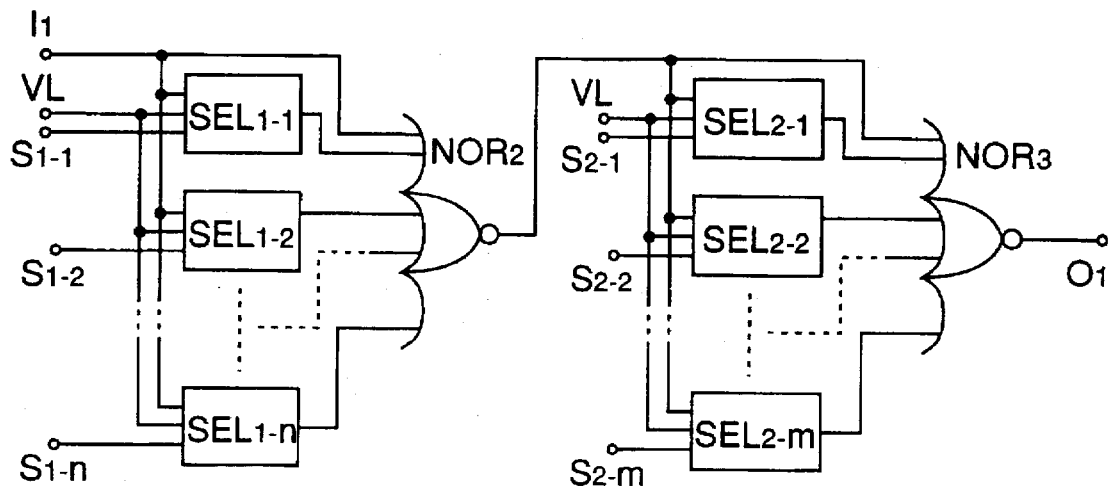
FIG. 6 is a diagram illustrating a variable delay circuit in accordance with a third embodiment of the present invention.

FIG. 6 is a diagram illustrating a variable delay circuit in accordance with a third embodiment of the present invention.

In this third embodiment, a delay time from a rising edge (falling edge) of an input signal to a rising edge (falling edge) of an output signal in a digital circuit is varied in response to a control signal. In the circuit structure according to this third embodiment, a second variable delay circuit is connected to the output side of the variable delay circuit according to the second embodiment (hereinafter referred to as first variable delay circuit). The second variable delay circuit comprises a second data signal input terminal to which an output signal from the first variable delay circuit is input, a low-level input terminal $V_L$, second delay time control signal input terminals $S_{2-1}$ to $S_{2-m}$ (m=integer, $1 \leq m$), second selector circuits $SEL_{2-1}$ to $SEL_{2-m}$ each selecting one of output signals from the second delay time control signal input terminals $S_{2-1}$ to $SEL_{2-m}$ in response to these signals, and an (m+1)-input NOR circuit 3 receiving an output signal from the second data signal input terminal and output signals from the second selector circuits $SEL_{2-1}$ to $SEL_{2-m}$ and producing a logical sum of these signals. Hereinafter, the second selector circuits $SEL_{2-1}$ to $SEL_{2-m}$ are referred to as $SEL_{2-i}$ ($1 \leq i \leq m$), and the terminals $S_{2-1}$ to $S_{2-m}$ are referred to as $S_{2-i}$, for simplification. Further, reference characters $S_{1-1}$ to $S_{1-n}$ denote first delay time control signal input terminals, and reference characters $SEL_{1-1}$ to $SEL_{1-n}$ (n=integer, $1 \leq n$) denote first selector circuits. The first selector circuits $SEL_{1-1}$ to $SEL_{1-n}$ are referred to as $SEL_{1-i}$ ($1 \leq i \leq n$), and the terminals $S_{1-1}$ to $S_{1-n}$ are referred to as $S_{1-i}$, for simplification.

That is, the circuit structure according to this third embodiment is obtained by replacing the inverter INV with a delay time control circuit 300 in the circuit structure shown in FIG. 4 according to the second embodiment of the invention.

The operation of the delay circuit will be described.

When the signal at the data input terminal $I_1$ is input to an input terminal of the (n+1)-input NOR circuit $NOR_2$ according to the first delay time control signals $S_{1-i}$, the signal output from the (n+1)-input NOR circuit $NOR_2$, i.e., an inverted signal $\overline{I_1}$ of the data input signal $I_1$, is input to an input terminal of the (m+1)-input NOR circuit $NOR_3$ according to the second delay time control signals $S_{2-i}$, and the signal at the low-level input terminal $V_L$ is input to the other input terminals of the NOR circuits $NOR_2$ and $NOR_3$, it is assumed that the delay time from the input terminal $I_1$ to the output terminal $O_1$ when the signal at the input terminal $I_1$ rises from "L" to "H" is $T_{ao}$ and the delay time from the input terminal $I_1$ to the output terminal $O_1$ when the signal at the input terminal $I_1$ falls from "H" to "L" is $T_{bo}$.

A description is given of the operation of the delay circuit when only k (k=integer, $0 \leq k \leq i$) first selector circuits $SEL_{1-i}$ select the signal at the data input terminal $I_1$ and only 1 (l=integer, $0 \leq 1 \leq m$) second selector circuits $SEL_{2-i}$ select the inverted signal $\overline{I_1}$.

(1) When the input signal $I_1$ rises from "L" to "H":

In the first-stage delay time control circuit comprising the first selector circuits $SEL_{1-i}$, as described for the second embodiment of the invention, when the signal at the data input terminal $I_1$ is input to the (n+1)-input NOR circuit $NOR_2$ from the k selector circuits $SEL_{1-i}$, the delay time is reduced by k×ΔtL→H.

On the other hand, in the second-stage delay time control circuit comprising the second selector circuits $SEL_{2-i}$, since the inverted signal $\overline{I_1}$ of the data input signal $I_1$ is an input signal, the operation at the falling of the input signal $I_1$ from "H" to "L" occurs. That is, when the inverted signal $\overline{I_1}$ is input to the (m+1)-input NOR circuit $NOR_3$ from the 1 selector circuits $SEL_{2-i}$, the delay time is increased by 1×ΔtH→L. Therefore, the delay time $T_a$ of the variable delay circuit is represented by $$T_a=T_{ao}-[(k \times \Delta tL \rightarrow H)-(1 \times \Delta tH \rightarrow L)]$$

(2) When the input signal $I_1$ falls from "H" to "L":

In the second-stage delay time control circuit comprising the second selector circuits $SEL_{2-i}$, the operation at the rising of the input signal $I_1$ from "L" to "H" is performed. Therefore, the delay time $T_b$ of the variable delay circuit is represented by $$T_b=T_{bo}-[(k \times \Delta tH \rightarrow L)-(1 \times \Delta tL \rightarrow H)]$$

In this third embodiment of the invention, a delay time variable range larger than that obtained in the second embodiment is realized. In addition, the width of the output signal can be varied.

[Embodiment 4]

Figure 7:
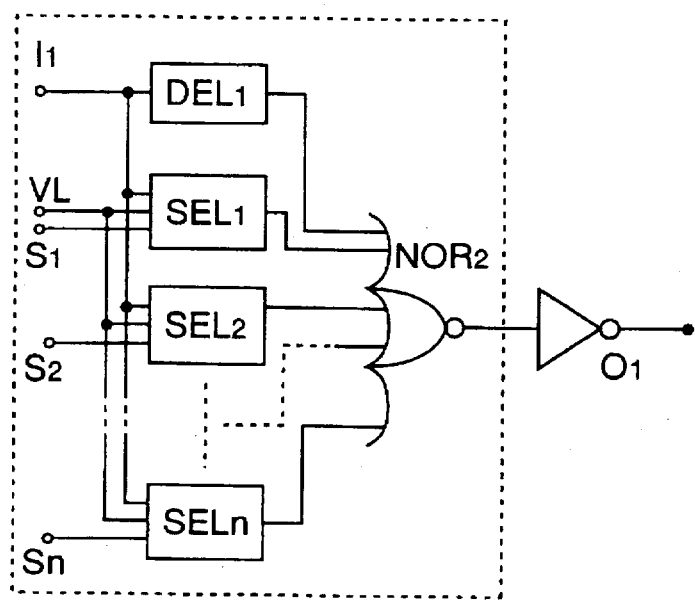
FIG. 7 is a diagram illustrating a variable delay circuit in accordance with a fourth embodiment of the present invention.

A delay circuit according to a fourth embodiment of the invention is shown in FIG. 7.

In this fourth embodiment, a delay time from a rising edge (falling edge) of an input signal to a rising edge (falling edge) of an output signal in a digital circuit is varied in response to a control signal. The circuit structure according to this fourth embodiment is identical to the circuit structure according to the second embodiment except that a delay element $DEL_1$ for timing control is connected between the data input terminal $I_1$ and the (n+1)-input NOR circuit $NOR_2$. A similar selector circuit as the selector circuits $SEL_i$ may be employed for the delay element $DEL_t$.

A description is given of the operation of the delay circuit.

Figure 8:
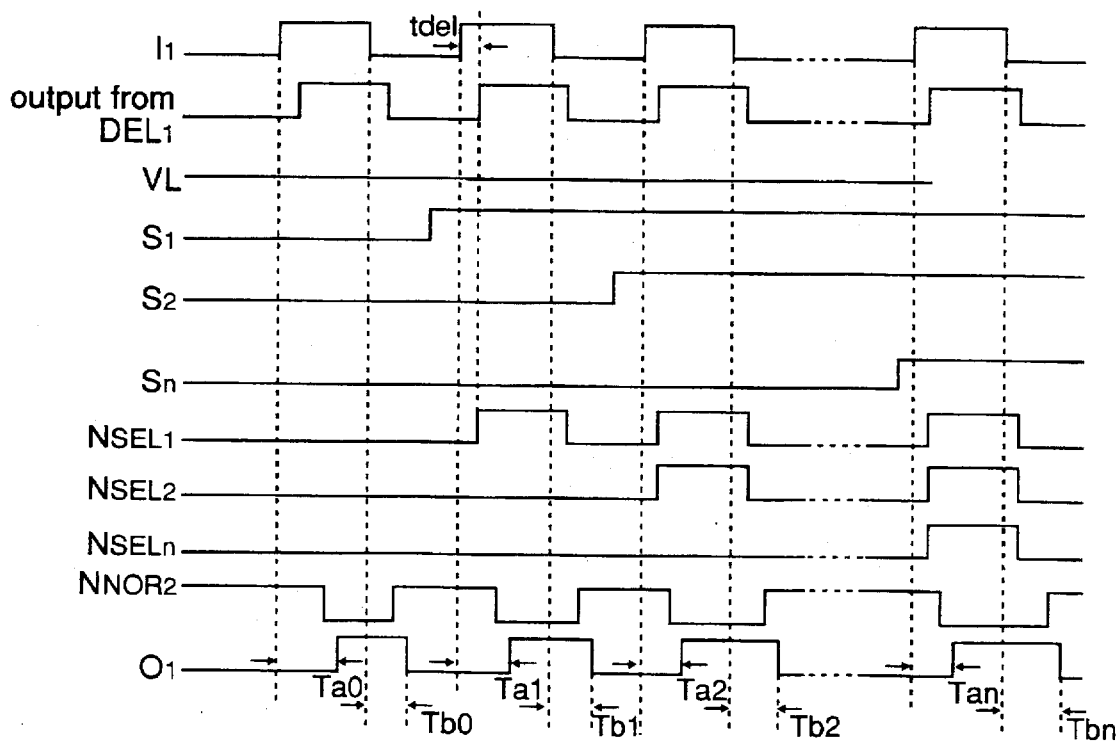
FIG. 8 is a timing chart of the variable delay circuit according to the fourth embodiment of the invention.

FIG. 8 is a timing chart of the variable delay circuit according to the fourth embodiment of the invention. The selector circuits $SEL_i$ select the data input signal $I_1$ when the delay time control signals $S_i$ are "H" and select the low-level input signal $V_L$ when the signals $S_i$ are "L".

In this fourth embodiment, since the delay element $DEL_1$ for timing control is connected between the input terminal $I_1$ and the (n+1)-input NOR circuit $NOR_2$, if it is assumed that the delay time where the delay element $DEL_1$ is similar to the selector circuits $SEL_i$ and is $t_{del}$, the signal at the input terminal $I_1$ is delayed by $t_{del}$ before it is input to the (n+1)-input NOR circuit $NOR_2$. Therefore, all of the signals input to the (n+1)-input NOR circuit $NOR_2$ are delayed by $t_{del}$ from the signal at the input terminal $I_1$, whereby the signal at the output terminal $O_1$ is delayed by a large margin.

According to the fourth embodiment of the invention, in a variable delay circuit that can control a delay time shorter than the delay time of a single-stage buffer circuit using digital circuits as described for the second embodiment of the invention, the timing when the signal at the data input terminal $I_1$ is input to the (n+1)-input NOR circuit $NOR_2$ through the selector circuit $SEL_i$ can be matched to the timing when the signal is directly input to the NOR circuit $NOR_2$, whereby the stability of the operation of the variable delay circuit is improved. In addition, the delay time from the rising edge (falling edge) of the input signal to the rising edge (falling edge) of the output signal is increased.

In the first to fourth embodiments, OR circuits may be employed in place of the NOR circuits with the same effects as described above.

[Embodiment 5]

Figure 9:
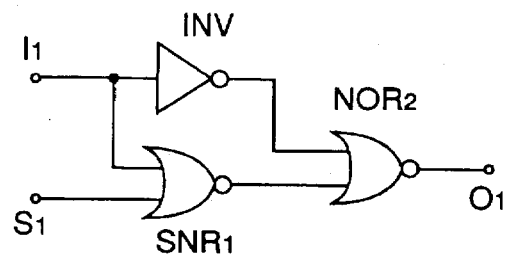
FIG. 9 is a diagram illustrating a variable delay circuit in accordance with a fifth embodiment of the present invention.

A variable delay circuit in accordance with a fifth embodiment of the invention is shown in FIG. 9.

In this fifth embodiment, a delay time from a rising edge (falling edge) of an input signal to a rising edge (falling edge) of an output signal in a digital circuit is varied in response to a control signal. This variable delay circuit comprises a data input terminal $I_1$, an inverter INV receiving a signal from the data input terminal $I_1$, a delay time control signal input terminal $S_1$, a two-input NOR selector circuit $SNR_2$ receiving the signal from the data input terminal $I_1$ and a signal from the delay time control signal input terminal $S_1$ and producing a logical sum of these signals, a two-input NOR circuit $NOR_2$ receiving a signal output from the inverter INV and a signal output from the two-input NOR selector circuit $SNR_2$ and producing a logical sum of these signals, and a data output terminal $O_1$ receiving a signal output from the NOR circuit $NOR_2$.

A description is given of the operation of the delay circuit.

Figure 10:
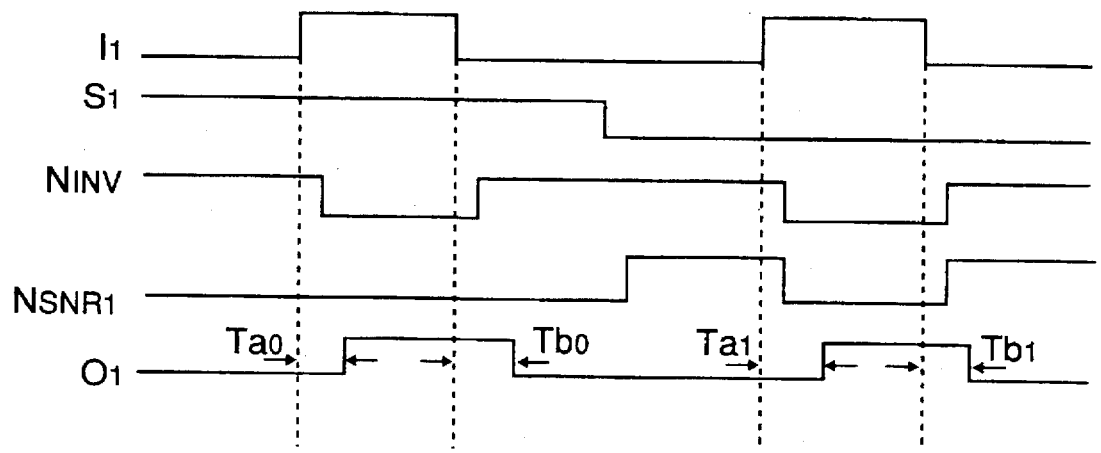
FIG. 10 is a timing chart of the variable delay circuit according to the fifth embodiment of the invention.

FIG. 10 is a timing chart of the variable delay circuit according to this fifth embodiment of the invention.

(1) When the signal at the delay time control signal input terminal $S_1$ is "L", the output signal $N_{SNR1}$ from the two-input NOR selector circuit $SNR_1$ is an inverted signal $\overline{I_1}$ of the input data signal $I_1$. Therefore, the inverted signal $\overline{I_1}$ is input to the both input ends of the two-input NOR circuit $NOR_2$.

(2) When the signal at the delay time control signal input terminal $S_1$ is "H", the output signal $N_{SNR1}$ from the two-input NOR selector circuit $SNR_1$ is "L". Therefore, the inverted signal $\overline{I_1}$ and the "L" signal are input to the two-input NOR circuit $NOR_2$.

As in the first embodiment of the invention, when the inverted signal $\overline{I_1}$ rises, i.e., when the signal $I_1$ falls, the delay time is shorter in case (1) where the selector circuit selects the inverted signal $\overline{I_1}$, i.e., the delay time control signal input terminal $S_1$ is "L", than in case (2). The difference in the delay times is $\Delta tL \rightarrow H$.

On the other hand, when the inverted signal $\overline{I_1}$ falls, i.e., when the signal $I_1$ rises, the delay time is longer in case (1) than in case (2). The difference in the delay times is $\Delta tH \rightarrow L$.

According to this fifth embodiment of the invention, in the variable delay circuit according to the first embodiment, a two-input NOR circuit is employed in place of the selector circuit $SEL_1$. Therefore, it is possible to control a delay time shorter than the delay time of a single-stage inverter circuit with a relatively simple circuit structure compared to the circuit structure according to the first embodiment.

In the variable delay circuit according to this fifth embodiment, a buffer circuit may be employed in place of the inverter INV.

[Embodiment 6]

Figure 11:
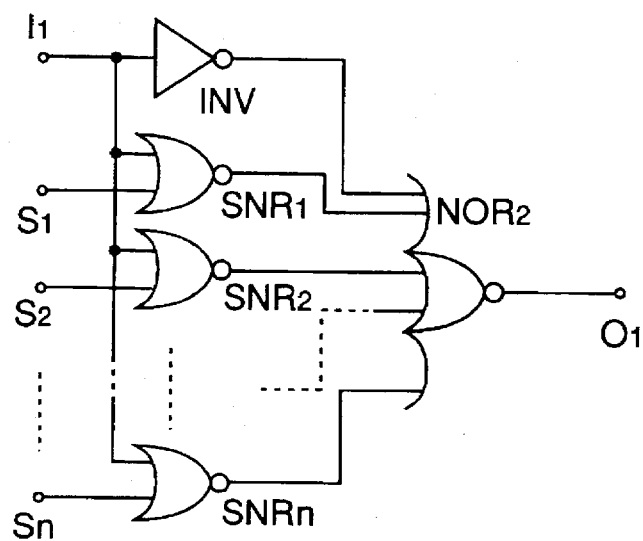
FIG. 11 is a diagram illustrating a variable delay circuit in accordance with a sixth embodiment of the present invention.

A variable delay circuit according to a sixth embodiment of the present invention is shown in FIG. 11.

In this sixth embodiment of the invention, a delay time from a rising edge (falling edge) of an input signal to a rising edge (falling edge) of an output signal in a digital circuit is varied in response to a control signal. More specifically, the two-input NOR selector circuit $SNR_2$ according to the fifth embodiment that produces a logical sum of the signal at the data input terminal $I_1$ and the signal at the delay time control signal input terminal $S_1$ is replaced with two-input NOR selector circuits $SNR_1$ to $SNR_n$, each of which produces a logical sum of the signal at the data input terminal $I_1$ and the signal at the delay time control signal input terminal $S_i$ (i=integer, $1 \leq i \leq n$). Further, the two-input NOR circuit $NOR_2$ which produces a logical sum of the signal output from the inverter INV and the signal output from the two-input NOR selector circuit $SNR_2$ and outputs a signal to the data output terminal $O_1$ is replaced with an (n+1)-input NOR circuit $NOR_2$ which produces a logical sum of the signal output from the inverter INV and the signals output from the two-input NOR selector circuits $SNR_1$ to $SNR_n$ and outputs a signal to the data output terminal $O_1$.

A description is given of the operation of the variable delay circuit according to this sixth embodiment of the invention. For simplification, the two-input NOR selector circuits $SNR_1$ to $SNR_n$ are referred to as $SNR_i$ (i=integer, $1 \leq i \leq n$).

Figure 12:
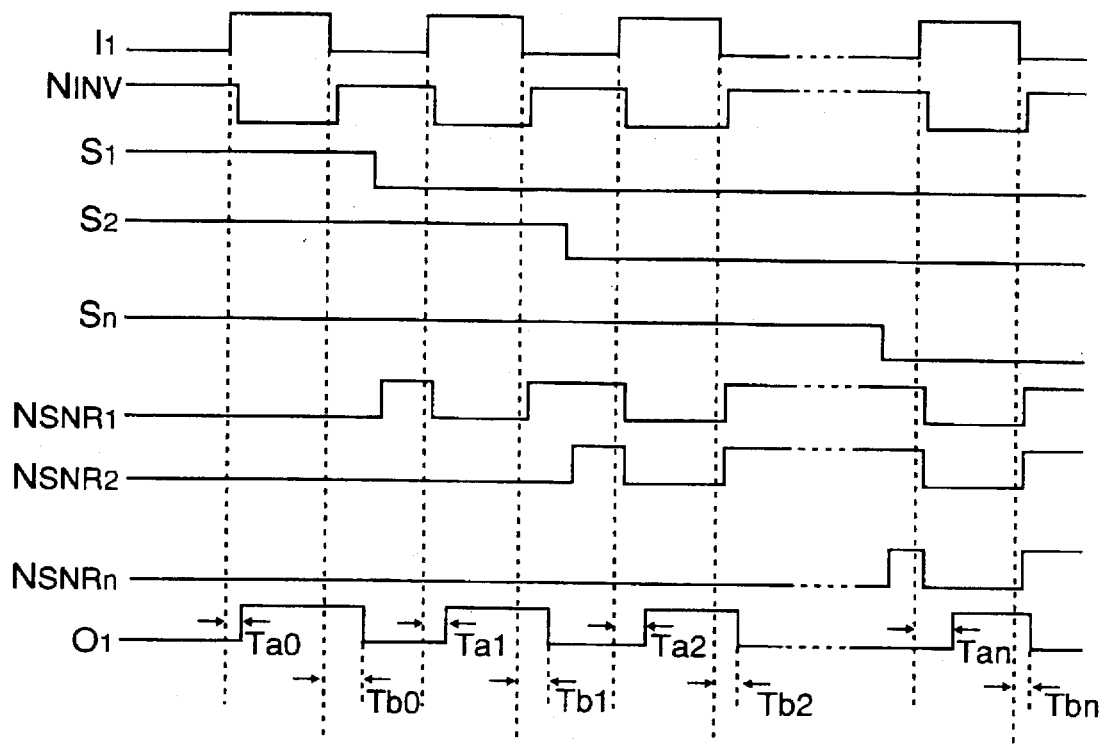
FIG. 12 is a timing chart of the variable delay circuit according to the sixth embodiment of the invention.

FIG. 12 is a timing chart of the variable delay circuit.

Initially, when all of the delay time control signals $S_i$ are "H", i.e., when the signal $\overline{I_1}$ is input to one of the input terminals of the (n+1)-input NOR circuits $NOR_2$ and the L signal is input to the rest of the input terminals, it is assumed that the delay time of the variable delay circuit from the input terminal $I_1$ to the output terminal $O_1$ when the signal at the input terminal $I_1$ rises from "L" to "H" is $T_{ao}$, and the delay time from the input terminal $I_1$ to the output terminal $O_1$ when the signal at the input terminal $I_1$ falls from "H" to "L" is $T_{bo}$.

A description is given of the operation when only k (k=integer, $1 \leq k \leq n$) two-input NOR selector circuits $SNR_i$ select the signal $\overline{I_1}$.

(1) When the inverted signal $\overline{I_1}$ rises from "L" to "H", i.e., when the data input signal $I_1$ falls:

As described for the second embodiment of the invention, when the signal $\overline{I_1}$ is input to the (n+1)-input NOR circuit $NOR_2$ from the k two-input NOR selector circuits $SNR_i$, the delay time is reduced by $k \times \Delta tL \rightarrow H$. Therefore, the delay time $T_a$ of the variable delay circuit is represented by $$T_a = T_{ao} - (k \times \Delta tL \rightarrow H)$$

(2) When the inverted signal $\overline{I_1}$ falls from "H" to "L", i.e., when the data input signal $I_1$ rises:

As described for the second embodiment of the invention, when the signal $\overline{I_1}$ is input to the (n+1)-input NOR circuit $NOR_2$ from the k two-input NOR selector circuits $SNR_i$, the delay time is increased by $k \times \Delta tH \rightarrow L$. Therefore, the delay time $T_b$ of the variable delay circuit is represented by $$T_b = T_{bo} - (k \times \Delta tH \rightarrow L)$$

Therefore, in the variable delay circuit according to this sixth embodiment, a variable delay time range larger than that obtained in the fifth embodiment is realized.

In the fifth and sixth embodiments of the invention, a buffer circuit may be employed in place of the inverter, a two-input OR circuit may be employed in place of the two-input NOR selector circuit, and an (n+1)-input AND circuit may be employed in place of the (n+1)-input NOR circuit, with the same effects as described above.

[Embodiment 7]

Figure 13:
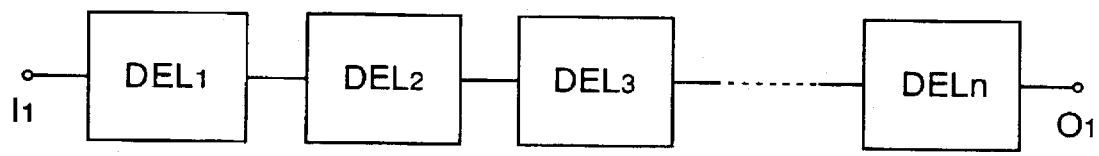
FIG. 13 is a diagram illustrating a variable delay circuit in accordance with a seventh embodiment of the present invention.

A variable delay circuit according to a seventh embodiment of the present invention is shown in FIG. 13.

In this seventh embodiment of the invention, a delay time from a rising edge (falling edge) of an input signal to a rising edge (falling edge) of an output signal in a digital circuit is varied in response to a control signal. As shown in FIG. 13, variable delay circuits $DEL_1$ to $DEL_n$ according to any or all of the first to sixth embodiments are connected in series. Therefore, it is possible to control a delay time shorter than the delay time of a single-stage buffer circuit in a large variable delay time range.

[Embodiment 8]

Figure 14:
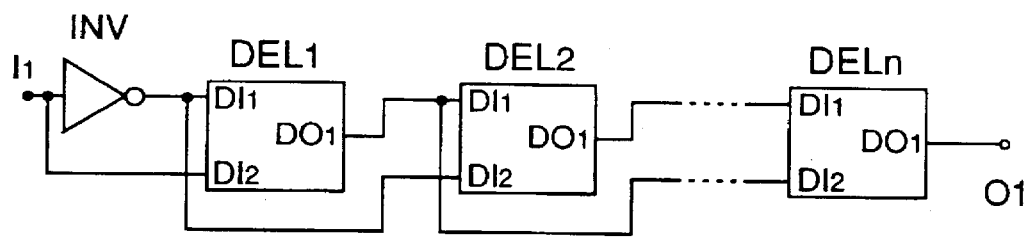
FIG. 14 is a diagram illustrating a variable delay circuit in accordance with an eighth embodiment of the present invention.

A variable delay circuit according to an eighth embodiment of the present invention is shown in FIG. 14.

Figure 15:
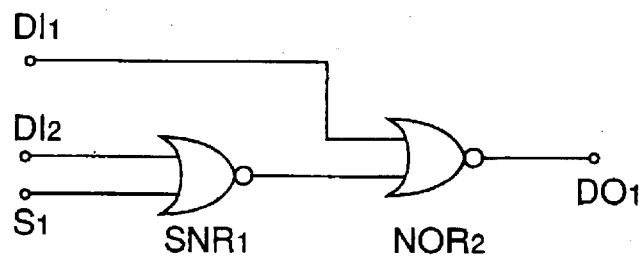
FIG. 15 is a diagram illustrating a partial delay circuit included in the variable delay circuit shown in FIG. 14.

In this eighth embodiment of the invention, a delay time from a rising edge (falling edge) of an input signal to a rising edge (falling edge) of an output signal in a digital circuit is varied in response to a control signal. This variable delay circuit comprises a data signal input terminal $I_1$, an inverter INV receiving a signal from the data signal input terminal $I_1$, and a plurality of partial delay circuits $DEL_1$ to $DEL_n$. The first partial delay circuit $DEL_1$ receives an output signal from the inverter INV as a first input and a signal from the data input terminal $I_1$ as a second input. The second partial delay circuit $DEL_2$ receives an output signal from the first partial delay circuit $DEL_1$ as a first input and the output signal from the inverter INV as a second input. The i-th (i=integer, $3 \leq i \leq n$) partial delay circuit receives an output signal from the (i−1)th partial delay circuit as a first input and an output signal from the (i−2)th partial delay circuit as a second input. FIG. 15 shows the i-th partial delay circuit in detail. As shown in FIG. 15, the i-th partial delay circuit comprises a two-input NOR selector circuit $SNR_1$ that produces a logical sum of the second input and a select signal $S_1$, and a two-input NOR circuit $NOR_2$ that produces a logical sum of the first input and an output signal from the two-input NOR selector circuit $SNR_1$.

That is, the variable delay circuit according to this eighth embodiment is obtained by connecting the variable delay circuits according to the fifth embodiment in series, and the inverter INV included in the variable delay circuit is omitted.

A description is given of the operation of the variable delay circuit.

The fundamental operation of each partial delay circuit is identical to the operation of the variable delay circuit according to the fifth embodiment except that the output signal from the (i−2)th partial delay circuit is input to the i-th partial delay circuit in this eighth embodiment in place of the inverted signal $\overline{I_1}$ produced by the inverter INV in the fifth embodiment.

Also in the variable delay circuit according to this eighth embodiment of the invention, it is possible to control a delay time shorter than the delay time of a single-stage buffer circuit in a large variable delay time range. In addition, since the inverter is dispensed with, the power consumption is reduced.

[Embodiment 9]

Figure 16:
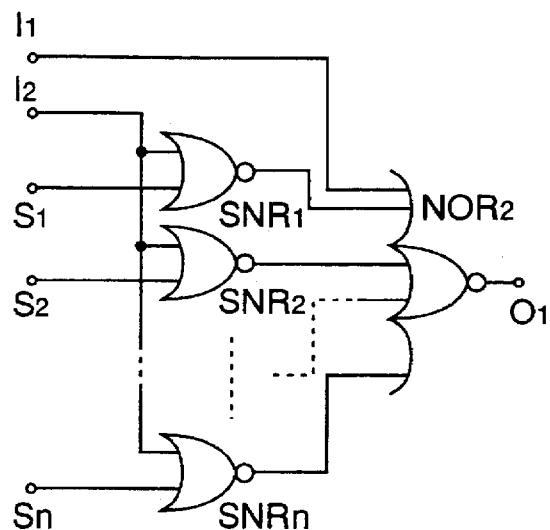
FIG. 16 is a diagram illustrating a variable delay circuit in accordance with a ninth embodiment of the present invention.

A variable delay circuit according to a ninth embodiment of the invention is shown in FIG. 16.

In this ninth embodiment of the invention, a delay time from a rising edge (falling edge) of an input signal to a rising edge (falling edge) of an output signal in a digital circuit is varied in response to a control signal. In this embodiment, the i-th partial delay circuit in the variable delay circuit according to the eighth embodiment of the invention is replaced with a partial delay circuit comprising two-input NOR selector circuits $SNR_1$ to $SNR_n$ receiving the second input signal and select signals $S_1$ to $S_n$, respectively, and an (n+1)-input NOR circuit $NOR_2$ receiving the above-described first input signal and output signals from the two-input NOR selector circuits $SNR_1$ to $SNR_n$.

Accordingly, it is possible to control a delay time shorter than the delay time of a single-stage buffer circuit in a larger variable delay time range than that of the eighth embodiment of the invention. In addition, since the inverter is dispensed with, the power consumption is reduced.

[Embodiment 10]

Figure 17:
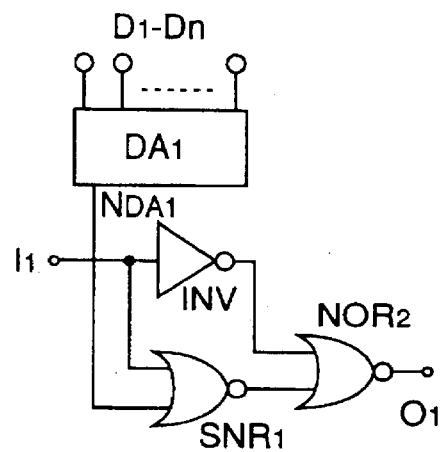
FIG. 17 is a diagram illustrating a variable delay circuit in accordance with a tenth embodiment of the present invention.

A variable delay circuit according to a tenth embodiment of the present invention is shown in FIG. 17.

In this tenth embodiment of the invention, a delay time from a rising edge (falling edge) of an input signal to a rising edge (falling edge) of an output signal in a digital circuit is varied in response to a control signal. The variable delay circuit comprises a digital/analog converter circuit $DA_1$ receiving delay time control signals $D_1$ to $D_n$, an inverter INV receiving a signal from the data input terminal $I_1$, a two-input NOR selector circuit $SNR_1$ that produces a logical sum of the signal from the data input terminal $I_1$ and a signal output from an output node $N_{DA1}$ of the digital/analog converter circuit $DA_1$, and a two-input NOR circuit $NOR_2$ that produces a logical sum of an output signal from the inverter INV and an output signal from the two-input NOR selector circuit $SNR_1$ and outputs a signal to the data output terminal $O_1$.

These circuits are DCFL (Direct Coupled FET Logic) circuits. In addition, the digital/analog converter circuit $DA_1$ outputs a signal voltage close to the threshold voltage of the logic gate to the output node $N_{DA1}$.

A description is given of the operation of the variable delay circuit.

(1) When the signal at the input terminal $I_1$ rises from "L" to "H":

The data signal at the data input terminal $I_1$ and the data signal at the output node $N_{DA}1$ of the digital/analog converter circuit $DA_1$ are input to the two-input NOR selector circuit $SNR_1$. At this time, since the output node $N_{DA1}$ is at a voltage close to of the threshold voltage, a signal $\bar{I}_1$ with reduced amplitude, i.e., a signal with lowered high level, is output from the two-input NOR selector circuit $SNR_1$. The larger the voltage at the output node $N_{DA1}$ is, the smaller the amplitude is.

When the signal at the input terminal $I_1$ rises, the delay time is reduced with an increase in amplitude. The reason is as follows. When the amplitude is large, i.e., when the high level is high, the drain to source resistance of the transistor Tr.2 in the two-input NOR circuit $NOR_2$ is reduced and the discharge time for charge stored at the gate of the transistor Tr.3 is reduced. While in the first embodiment the discharge is performed by one transistor or two transistors, in this tenth embodiment the discharge is performed by (1+α) transistors (0≦α≦1).

Therefore, it is possible to control a shorter delay time than in the first embodiment of the invention, in response to the voltage of the output node $N_{DA1}$. In this case, the delay time is reduced with a reduction in the voltage at the output node $N_{DA1}$.

(2) When the signal at the input terminal $I_1$ falls from "H" to "L":

The data signal at the data input terminal $I_1$ and the data signal at the output node $N_{DA}1$ of the digital/analog converter circuit $DA_1$ are input to the two-input NOR selector circuit $SNR_1$. At this time, since the output node $N_{DA1}$ is at a voltage close to the threshold voltage, a signal $\bar{I}_1$ with reduced amplitude, i.e., a signal with lowered high level, is output from the two-input NOR selector circuit $SNR_1$. The larger the voltage at the output node $N_{DA1}$ is, the smaller the amplitude is.

When the signal at the input terminal $I_1$ falls, the delay time is increased with an increase in the amplitude. The reason is as follows. When the amplitude is large, i.e., when the high level is high, the electrical charge accumulated in the drain to source capacitance of the transistor Tr.2 in the two-input NOR circuit $NOR_2$ is increased, and the time required for accumulating the electrical charge in the gate capacitance of the transistor Tr.3 is increased. Therefore, it is possible to control a shorter delay time than in the first embodiment of the invention, in response to the voltage of the output node $N_{DA1}$. In this case, the delay time is increased with a reduction in the voltage.

As described above, in this tenth embodiment, since the digital/analog converter circuit $DA_1$ is employed, a variable delay time interval shorter than realized in the first to ninth embodiments is realized.

[Embodiment 11]

Figure 18:
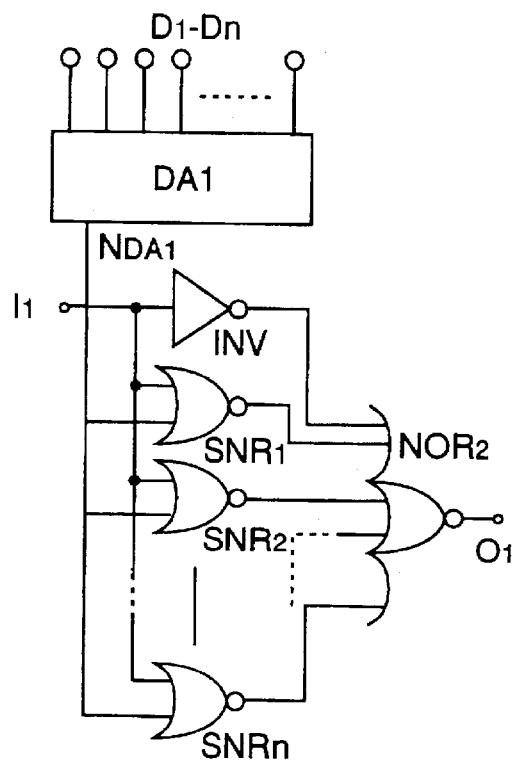
FIG. 18 is a diagram illustrating a variable delay circuit in accordance with an eleventh embodiment of the present invention.

A variable delay circuit according to an eleventh embodiment of the invention is shown in FIG. 18.

In this eleventh embodiment of the invention, a delay time from a rising edge (falling edge) of an input signal to a rising edge (falling edge) of an output signal in a digital circuit is varied in response to a control signal. In the variable delay circuit according to the tenth embodiment of the invention, the two-input NOR selector $SNR_1$ that produces a logical sum of the signal from the data input terminal $I_1$ and the output signal from the output node $N_{DA1}$ of the digital/analog converter circuit $DA_1$ is replaced with two-input NOR selector circuits $SNR_1$ to $SNR_n$, each of which produces a logical sum of the signal at the data input terminal $I_1$ and the signal from the output node $N_{DA1}$ of the digital/analog converter circuit $DA_1$. In addition, the two-input NOR circuit $NOR_2$ that produces a logical sum of the output signal from the inverter INV and the output signal from the two-input NOR selector circuit $SNR_1$ and outputs a signal to the data output terminal $O_1$ is replaced with an (n+1)-input NOR circuit $NOR_2$ that produces a logical sum of the output signal from the inverter INV and output signals from the two-input NOR selector circuits $SNR_1$ to $SNR_n$ and outputs a signal to the data output terminal $O_1$.

These circuits are DCFL (Direct Coupled FET Logic) circuits. In addition, the digital/analog converter circuit $DA_1$ outputs a signal of a voltage close to the threshold voltage of the logic gate to the output node $N_{DA1}$.

In the variable delay circuit according to this eleventh embodiment of the invention, the delay time can be controlled in a wider range than in the tenth embodiment of the invention.

[Embodiment 12]

Figure 19:
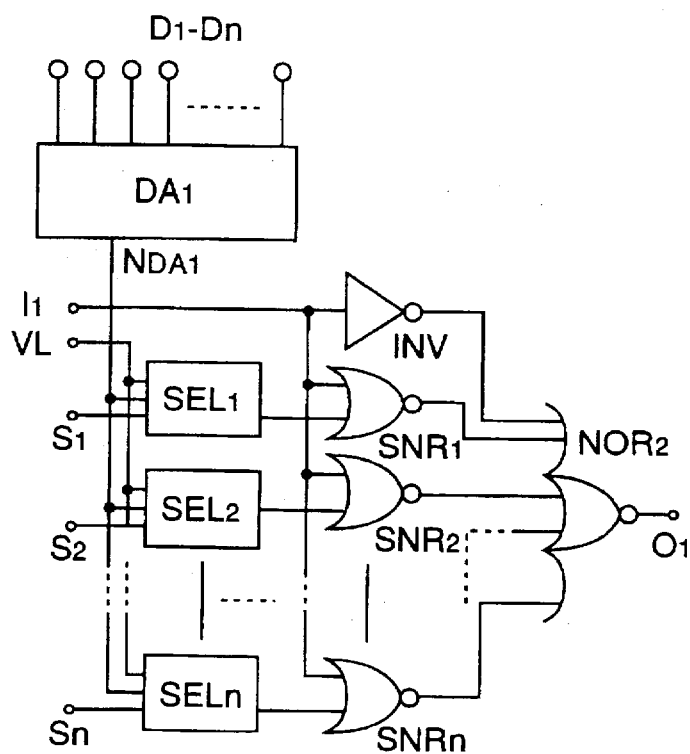
FIG. 19 is a diagram illustrating a variable delay circuit in accordance with a twelfth embodiment of the present invention.

A variable delay circuit according to a twelfth embodiment of the present invention is shown in FIG. 19.

In this twelfth embodiment of the invention, a delay time from a rising edge (falling edge) of an input signal to a rising edge (falling edge) of an output signal in a digital circuit is varied in response to a control signal. The variable delay circuit according to this twelfth embodiment is obtained by connecting selector circuits $SEL_1$ to $SEL_n$ between the output node $N_{DA1}$ of the digital/analog converter circuit $DA_1$ and the respective two-input NOR selector circuits $SNR_1$ to $SNR_n$ in the variable delay circuit according to the eleventh embodiment of the invention. The selector circuits $SEL_1$ to $SEL_n$ select either the signal at the L signal input terminal VL of the logic gate or the signal at the output node $N_{DA1}$ of the digital/analog converter circuit $DA_1$ in response to signals at the select signal input terminals $S_1$ to $S_n$, respectively.

These circuits are DCFL (Direct Coupled FET Logic) circuits. In addition, the digital/analog converter circuit $DA_1$ outputs a voltage close to the threshold voltage of the logic gate to the output node $N_{DA1}$.

In the variable delay circuit according to this twelfth embodiment of the invention, by switching the digital circuit in response to the signals at the delay time control signal input terminals $S_1$ to $S_n$, a variable delay time interval shorter than that obtained in the eleventh embodiment is realized.

In place of the selector circuits $SEL_1$ to $SEL_n$, selector circuits that select either the signal at the H signal input terminal VH of the logic gate or the signal at the output node $N_{DA1}$ of the digital/analog converter circuit $DA_1$ may be employed. Alternatively, selector circuits that select one of the signal at the L signal input terminal VL of the logic gate, the signal at the H signal input terminal VH of the logic gate, and the signal at the output node $N_{DA1}$ of the digital/analog converter circuit $DA_1$ may be employed. In this case, a shorter variable delay time interval is realized.

[Embodiment 13]

Figure 20:
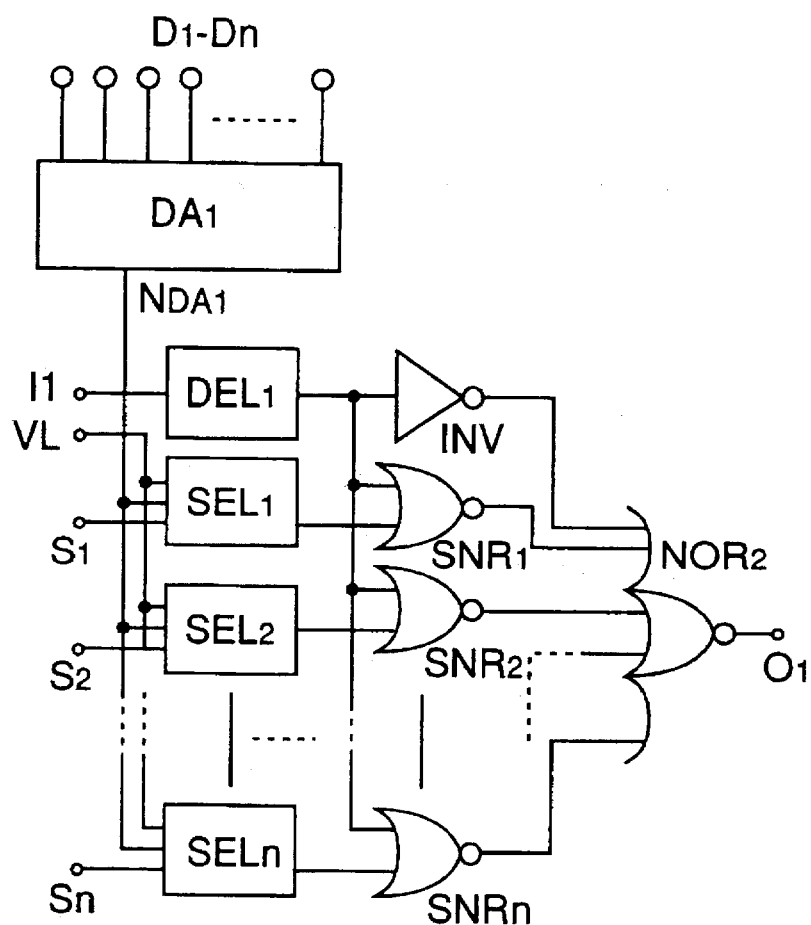
FIG. 20 is a diagram illustrating a variable delay circuit in accordance with a thirteenth embodiment of the present invention.

A variable delay circuit according to a thirteenth embodiment of the present invention is shown in FIG. 20.

In this thirteenth embodiment of the invention, a delay time from a rising edge (falling edge) of an input signal to a rising edge (falling edge) of an output signal in a digital circuit is varied in response to a control signal. The variable delay circuit according to this thirteenth embodiment is obtained by connecting a delay element $DEL_1$ for timing control between the data input terminal $I_1$ and the inverter INV in the variable delay circuit according to the twelfth embodiment of the invention.

In this embodiment, since the delay element $DEL_1$ is included in the variable delay circuit according to the twelfth embodiment, the timing (rising and falling) of the data signal in case where the signal at the data input terminal $I_1$ is input to the (n+1)-input NOR circuit $NOR_2$ through the selector circuits $SEL_1$ to $SEL_n$ can be matched to the timing in case where that signal is directly input to the (n+1)-input NOR circuit $NOR_2$. Therefore, the stability of the operation of the variable delay circuit is improved. In addition, the delay time from the rising edge (falling edge) of the input signal to the rising edge (falling edge) of the output signal is increased.

In the eighth to thirteenth embodiments a buffer circuit may be employed in place of the inverter, a two-input OR circuit may be employed in place of the two-input NOR selector circuit, and an (n+1)-input AND circuit may be employed in place of the (n+1)-input NOR circuit, with the same effects as described above.

The variable delay circuits according to the first to thirteenth embodiments of the invention can be SCFL (Source Coupled FET Logic) circuits.

[Embodiment 14]

This fourteenth embodiment of the invention relates to an example of the (n+1)-input NOR circuit $NOR_2$ used in the variable delay circuits according to the first to thirteenth embodiments of the invention.

Figure 21:
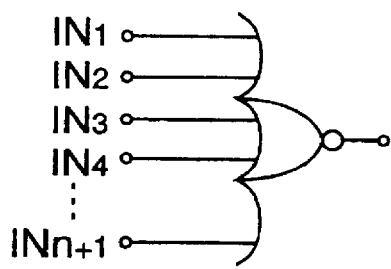
FIGS. 21(a) and 21(b) are a pattern diagram and a circuit diagram, respectively, illustrating signal input transistors for an (n+1) input NOR circuit according to any of the first to thirteenth embodiments, in accordance with a fourteenth embodiment of the present invention.
Figure 21:
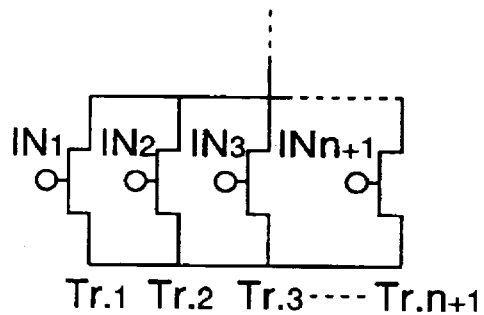

FIGS. 21(a) and 21(b) shows a pattern and a circuit structure of signal input transistors of the (n+1)-input NOR circuit $NOR_2$, respectively. In the figures, reference characters $Tr._1$ to $Tr._{n+1}$ denote the signal input transistors, and reference characters $IN_1$ to $IN_{n+1}$ denote input terminals of the (n+1)-input NOR circuit $NOR_2$.

In the variable delay circuits according to the first to thirteenth embodiments of the invention, the delay time is controlled utilizing the source to drain resistances and the source to drain capacitances of the signal input transistors, so the delay time varies with the size of the gates of the transistors. Therefore, a variable delay circuit that can control various delay times is realized by varying the size, such as gate length, of the signal input transistors of the (n+1)-input NOR circuit $NOR_2$.

[Embodiment 15]

This fifteenth embodiment of the present invention relates to an example of an input end of the delay time control signal input terminal $S_i$ (i=integer, $1 \leq i \leq n$) employed in the variable delay circuit according to the first to thirteenth embodiments of the invention.

Figure 22:
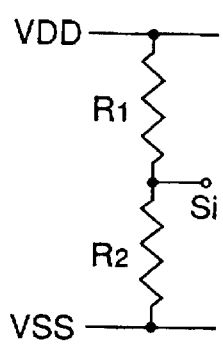
FIG. 22 is a diagram illustrating an input part of a delay time control signal input terminal included in a variable delay circuit in accordance with a fifteenth embodiment of the present invention.

FIG. 22 shows the input terminal of the delay time control signal input terminal $S_i$ in more detail. In the figure, reference characters $R_1$ and $R_2$ denote resistors connected to the power supply VDD and the power supply VSS in series, respectively.

In this fifteenth embodiment, in the state where the resistors $R_1$ and $R_2$ are connected in series, the values of the resistors $R_1$ and $R_2$ are appropriately selected so that the delay time control signal input terminal $S_i$ becomes "H", and a semiconductor device is fabricated. After fabrication of the semiconductor device, the resistor $R_1$ trimmed as needed and the delay time control signal input terminal $S_i$ is made "L", whereby the delay time is adjusted for normal operation of the semiconductor device.

When the delay time control signal input terminal having the structure shown in FIG. 22 is used in a semiconductor device, degradation of performance of the semiconductor device due to variation in delay time is suppressed, resulting in the normal operation of the semiconductor device.

[Embodiment 16]

Figure 23:
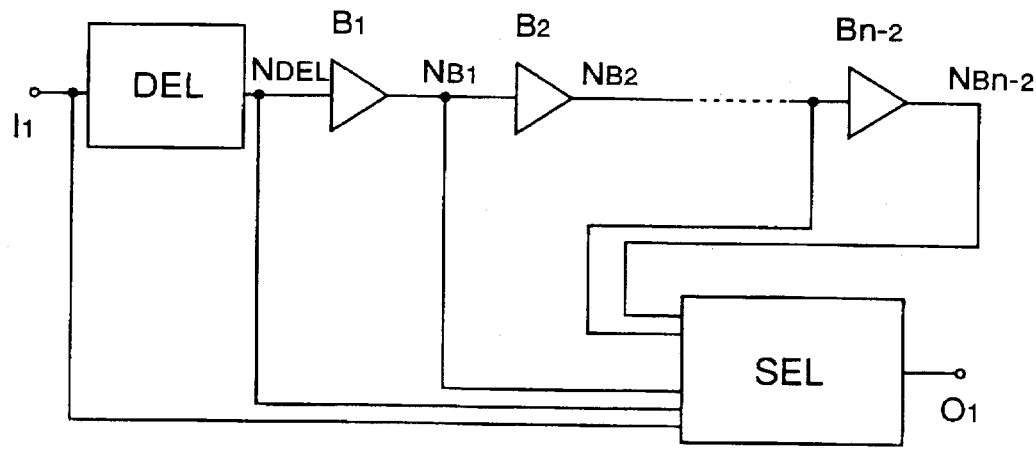
FIG. 23 is a diagram illustrating a variable delay circuit in accordance with a sixteenth embodiment of the present invention.

A variable delay circuit according to a sixteenth embodiment of the present invention is shown in FIG. 23.

In this sixteenth embodiment of the invention, a delay time from a rising edge (falling edge) of an input signal to a rising edge (falling edge) of an output signal in a digital circuit is varied in response to a control signal. In the variable delay circuit, a data input terminal $I_1$, a variable delay circuit DEL according to any of the first to fifteenth embodiments, buffer circuits $B_1$ to $B_{n-2}$ (n=an integer, $3 \leq n$), and a data output terminal $O_1$ are connected in series. Further, the delay circuit includes an n:1 selector circuit SEL having input nodes connected to the data input terminal $I_1$, an output node $N_{DEL}$ of the variable delay circuit DEL, and output nodes $N_{B1}$ to $N_{Bn-2}$ of the buffer circuits $B_1$ to $B_{n-2}$, respectively. The n:1 selector circuit SEL selects one of those terminal and nodes and outputs a signal of the selected terminal or node to the data output terminal $O_1$.

In this sixteenth embodiment, when the selector circuit SEL selects one of the data input terminal $I_1$, the output node $N_{DEL}$, and the output nodes $N_{Bi}$ (i=integer, $1 \leq i \leq n-2$), the delay time is represented by $$t_{SEL} + t_{DEL} + (i \times t_B)$$

where $t_{SEL}$ is the delay time (constant) of the selector circuit SEL, $t_{DEL}$ is the delay time (variable) of the variable delay circuit DEL, and $t_B$ is the delay time (constant) of the buffer circuits $B_1$ to $B_{n-2}$.

In this sixteenth embodiment of the invention, a delay time shorter than the delay time of a single-stage buffer circuit is controlled by the variable delay circuit DEL according to any of the first to fifth embodiments of the invention, and a delay time longer than the delay time of a single-stage buffer circuit is controlled by the selector circuit SEL.

[Embodiment 17]

Figure 24:
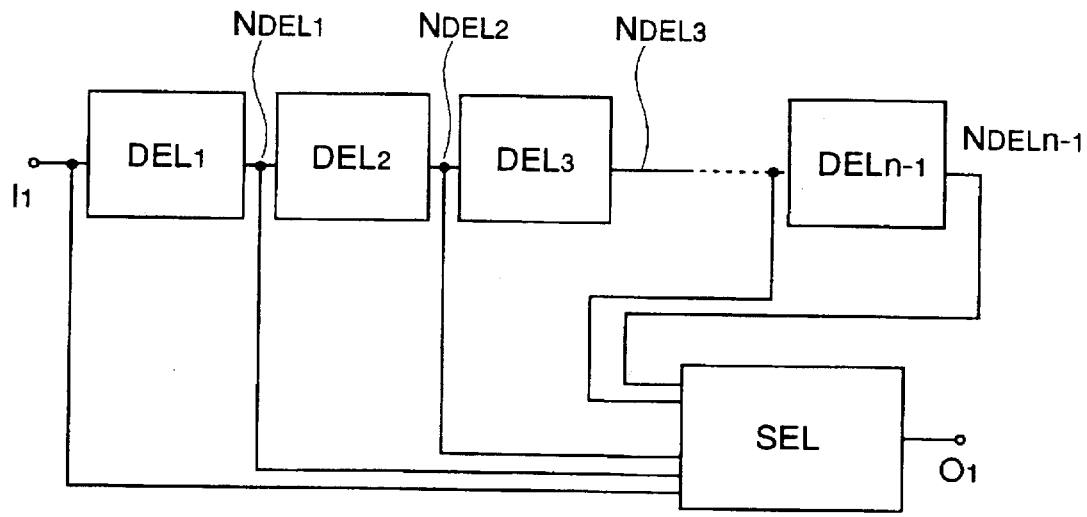
FIG. 24 is a diagram illustrating a variable delay circuit in accordance with a seventeenth embodiment of the present invention.

A variable delay circuit according to a seventeenth embodiment of the present invention is shown in FIG. 24.

In this seventeenth embodiment of the invention, a delay time from a rising edge (falling edge) of an input signal to a rising edge (falling edge) of an output signal in a digital circuit is varied in response to a control signal. In the variable delay circuit, a data input terminal $I_1$, variable delay circuits $DEL_1$ to $DEL_{n-1}$ (n=integer, $2 \leq n$) according to any of the first to sixteenth embodiments, and a data output terminal $O_1$ are connected in series. Further, the delay circuit includes an N:1 selector circuit SEL having input nodes connected to the data input terminal $I_1$ and output nodes $N_{DEL1}$ to $N_{DELn-1}$ of the variable delay circuit $DEL_1$ to $DEL_{n-1}$, respectively. The N:1 selector circuit SEL selects one of the terminal and the nodes and outputs a signal of the selected terminal or node to the data output terminal $O_1$.

In this seventeenth embodiment, when the selector circuit SEL selects one of the data input terminal $I_1$ and the output nodes $N_{DELi}$ (i=integer, $1 \leq i \leq n-1$), the delay time is represented by $$t_{SEL} + \Sigma t_{DELi}$$

where $t_{SEL}$ is the delay time (constant) of the selector circuit SEL and $t_{DELi}$ is the delay time (variable) of the variable delay circuits $DEL_1$ to $DEL_{n-1}$.

In this seventeenth embodiment, since the variable delay circuits $DEL_1$ to $DEL_{n-1}$ according to any of the first to sixteenth embodiments of the invention are connected in series and the signals from the output nodes $N_{DELi}$ of the respective variable delay circuits are selected by the selector circuit SEL, a delay time shorter than the delay time of a single-stage buffer circuit can be controlled in a wide range.

[Embodiment 18]

Figure 25:
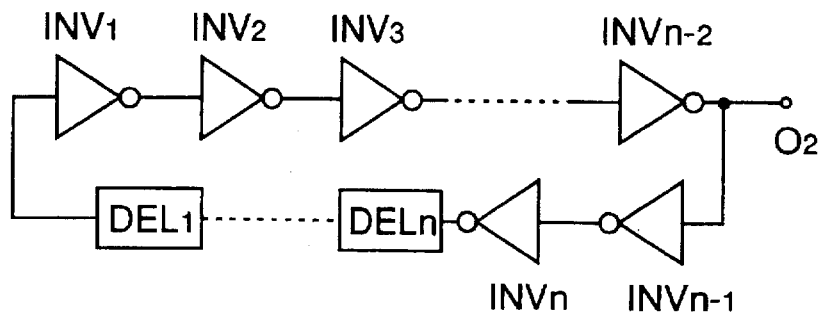
FIG. 25 is a diagram illustrating a ring oscillator circuit in accordance with an eighteenth embodiment of the present invention.

A variable delay circuit according to an eighteenth embodiment of the present invention is shown in FIG. 25.

The eighteenth embodiment of the invention relates to a ring oscillator in which the oscillation frequency is varied in response to a control signal. More specifically, in a ring oscillator circuit in which an odd number of inverters $INV_n$ (n=odd number) are connected in a ring, variable delay circuits $DEL_1$ to $DEL_n$ (n=integer, $1 \leq n$) according to any of the first to seventeenth embodiments are connected in series in at least a position between the inverters $INV_n$, and an output at an arbitrary position of the ring is connected to the data output terminal $O_2$.

Generally, an oscillation frequency of a ring oscillator is represented by f=½×(a delay time for one round of the ring)

So, the oscillation frequency can be controlled by inserting the variable delay circuits $DEL_1$ to $DEL_n$ in the ring.

In this eighteenth embodiment of the invention, a ring oscillator that can vary the oscillation frequency in response to control signals is realized.

[Embodiment 19]

Figure 26:
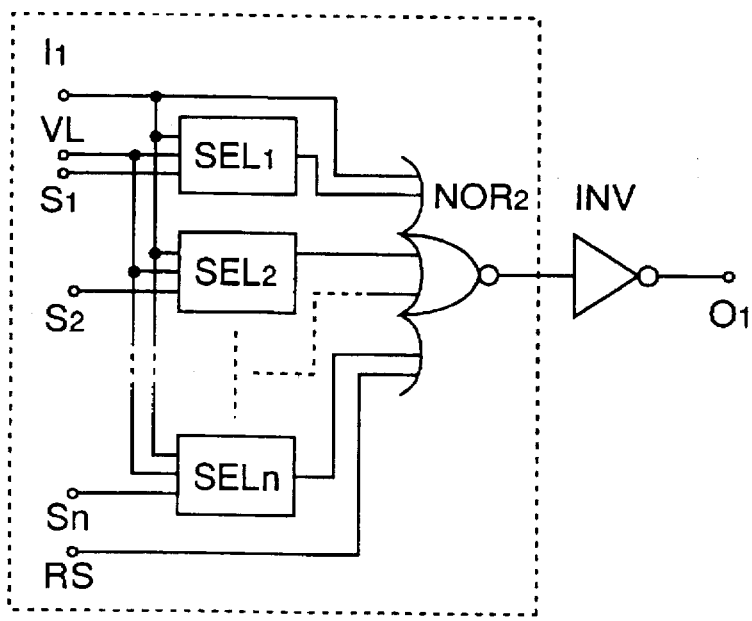
FIG. 26 is a diagram illustrating a resettable ring oscillator circuit in accordance with a nineteenth embodiment of the present invention.

FIG. 26 shows a variable delay circuit used for a resettable ring oscillator in accordance with a nineteenth embodiment of the present invention.

In this nineteenth embodiment, in the ring oscillator according to the eighteenth embodiment, the delay time control (n+1)-input NOR included in each of the variable delay circuits $DEL_1$ to $DEL_n$ is replaced with an (n+2)-input NOR to which a reset signal RS for compulsorily making an output of the NOR "H" or "L" is applied.

In the resettable ring oscillator having the described structure, the output terminal of the variable delay circuit can be made "H" during the oscillation of the ring circuit, in other words, the phase of the ring oscillator can be controlled.

[Embodiment 20]

Figure 27:
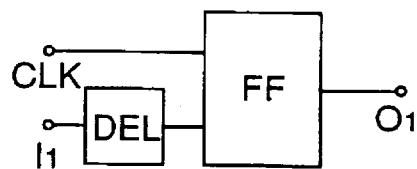
FIG. 27 is a diagram illustrating a timing adjustable flip-flop circuit in accordance with a twentieth embodiment of the present invention.
Figure 28:
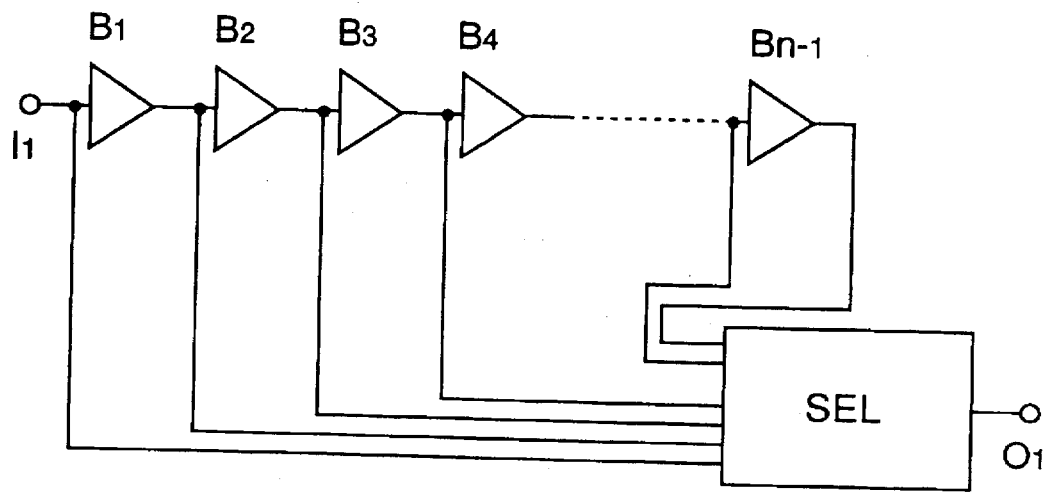
FIG. 28 is a diagram illustrating a variable delay circuit in accordance with the prior art.
Figure 29:
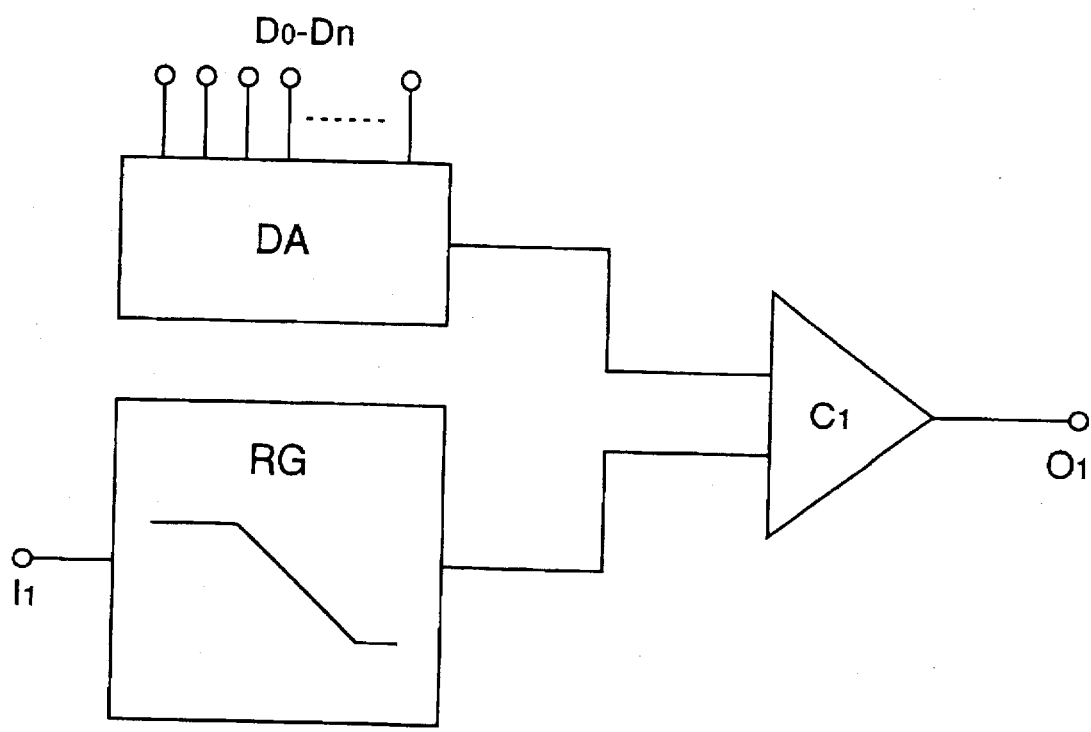
FIG. 29 is a diagram illustrating a variable delay circuit in accordance with the prior art.
Figure 30:
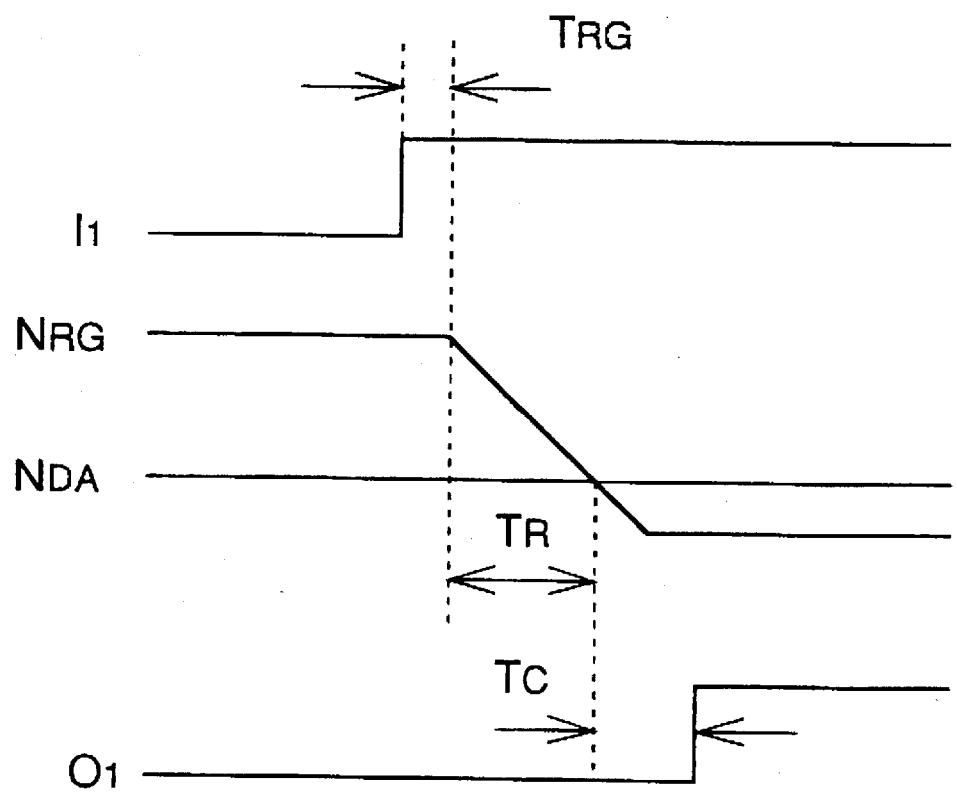
FIG. 30 is a diagram for explaining the operation of the variable delay circuit shown in FIG. 29.

FIG. 27 shows a timing adjustable flip-flop circuit in accordance with a twentieth embodiment of the present invention.

In a clock synchronous flip-flop circuit that operates synchronously with clock signals, a variable delay circuit DEL according to any of the first to seventeenth embodiments of the invention is connected between a data input signal terminal $I_1$ and an input terminal of a flip-flop circuit FF, whereby the timing of the signal at the clock input terminal CLK and the signal at the data input terminal $I_1$ is controlled.

Generally, in a clocked flip-flop circuit, there is a time between clock input and data input at which data is not correctly transmitted. In this twentieth embodiment, since the variable delay circuit DEL according to any of the first to seventeenth embodiments is inserted between the data input signal terminal $I_1$ and the input terminal of the flip-flop circuit FF, the timing of the clock input and the data input is controlled, whereby the data is correctly transmitted.

While in this twentieth embodiment the variable delay circuit DEL is connected between the data input terminal $I_1$ and the input terminal of the flip-flop circuit FF, it may be connected between the clock input terminal CLK and the input terminal of the flip-flop circuit FF.

What is claimed is:

1. A variable delay circuit for delaying an input signal by a variable delay time from a rising edge or a falling edge of the input signal to a rising edge or a falling edge of an output signal in a digital circuit, the variable delay circuit comprising:

a data signal input terminal;

a first signal input terminal for receiving a low level signal;

n selector circuits (n is an integer larger than 1), each selector circuit having an output terminal, a first selector input terminal, a second selector input terminal connected to the data signal input terminal, and a third selector input terminal connected to the first signal input terminal for selecting and supplying to the output terminal one of a signal applied to the data signal input terminal and the low level signal applied to the first signal input terminal in response to a selection signal applied to the first selector input terminal; and a first NOR circuit having an output terminal and (n+1)-input terminals respectively connected to the data signal input terminal and the output terminals of the n selector circuits.

2. The variable delay circuit of claim 1 further comprising:

a second variable delay circuit connected to the output terminal of the first NOR circuit, said second variable delay circuit comprising:

a second data signal input terminal connected to the output terminal of the first NOR circuit, a second signal input terminal for receiving a low-level signal, m selector circuits (m is an integer larger than 0), each selector circuit having an output terminal, a first selector input terminal, a second selector input terminal connected to the second data signal input terminal, and a third selector input terminal connected to the second signal input terminal for selecting and supplying to the output terminal one of a signal applied to the second data signal input terminal and the low level signal applied to the second signal input terminal in response to a selection signal applied to the first selector input terminal; and a second NOR circuit having an output terminal and (m+1)-input terminals respectively connected to the output terminal of the first NOR circuit and the output terminals of the m selector circuits.

3. The variable delay circuit of claim 1 further comprising:

delay element connected between the data signal input terminal and an input terminal of the (n+1)-input NOR circuit.

4. A variable delay circuit for delaying an input signal by a variable delay time from a rising edge or a falling edge of the input signal to a rising edge or a falling edge of a data output signal in a digital circuit, the variable delay circuit comprising:

a data signal input terminal;

an inverter having an output terminal and an input terminal connected to the data signal input terminal;

n two-input NOR selector circuits (n is an integer larger than 0), each NOR selector circuit having an output terminal, a first input terminal connected to the data signal input terminal, and a second input terminal to which a respective one of n select signals is applied; and a NOR circuit having an output terminal and (n+1)-input terminals respectively directly connected to the output terminal of the inverter and the output terminals of the n two-input NOR selector circuits.

5. A variable delay circuit for delaying an input signal by a variable delay time from a rising edge or a falling edge of the input signal to a rising edge or a falling edge of an output signal in a digital circuit, the variable delay circuit comprising:

a plurality of variable delay circuits connected in series, each variable delay circuit comprising:
a data signal input terminal;
a first signal input terminal for receiving a low level signal;
n selector circuits (n is an integer larger than 1), each selector circuit having an output terminal, a first selector input terminal, a second selector input terminal connected to the data signal input terminal, and a third selector input terminal connected to the first signal input terminal for selecting and supplying to the output terminal one of a signal applied to the data signal input terminal and the low level signal applied to the first signal input terminal in response to a selection signal applied to the first selector input terminal; and
a first NOR circuit having an output terminal and (n+1)-input terminals respectively connected to the data signal input terminal and the output terminals of the n selector circuits.

6. A variable delay circuit for delaying an input signal by a variable delay time from a rising edge or a falling edge of the input signal to a rising edge or a falling edge of an output signal in a digital circuit, the variable delay circuit comprising:

a data signal input terminal;
an inverter having an output terminal and an input terminal connected to the data signal input terminal;
a first partial delay circuit having an output terminal, a first input terminal connected to the output terminal of the inverter, and a second input terminal connected to the data signal input terminal;
a second partial delay circuit having an output terminal, a first input terminal connected to the output terminal of the first partial delay circuit, and a second input terminal connected to the output terminal of the inverter; and
an i-th partial delay circuit (i is an integer not less than 3) having an output terminal, a first input terminal connected to an output terminal of an (i−1)th partial delay circuit, and a second input terminal connected to an output terminal of an (i−2)th partial delay circuit, wherein each i-th partial delay circuit includes n two-input NOR selector circuits (n is an integer and i≦n) having respective output terminals, first input terminals connected to respective second input terminals of the i partial delay circuits, and second input terminals connected to receive respective select signals, and a NOR circuit having an output terminal and (n+1)-input terminals respectively connected to the first input terminals of the i partial delay circuits and the output terminals of the n two-input NOR selector circuits, the i-th partial delay circuit output terminal being the output terminal of the (n+1)-input NOR circuit.

7. A variable delay circuit for delaying an input signal by a variable delay time from a rising edge or a falling edge of the input signal to a rising edge or a falling edge of an output signal in a digital circuit, the variable delay circuit comprising:

a digital/analog converter circuit having an output terminal and n input terminals to which n delay time control signals (n is an integer larger than 1) are respectively applied;
an inverter having an output terminal and an input terminal connected to a data input signal terminal;
n two-input NOR selector circuits, each NOR selector circuit having an output terminal, a first input terminal connected to the data input signal terminal and a second input terminal connected to the output terminal of the digital/analog converter circuit; and
a NOR circuit having an output terminal and (n+1)-input terminals respectively connected to the output terminal of the inverter and the output terminals of the n two-input NOR selector circuits.

8. The variable delay circuit of claim 7 further comprising:

n selector circuits, each selector circuit having first, second, and third input terminals, the first terminals being connected to the output terminal of the digital/analog converter circuit, the second input terminals being connected, respectively, to n select signal input terminals, the third input terminals being connected, respectively, to low level signals, and respective output terminals respectively connected to second input terminals of the n two-input NOR selector circuits, the n selector circuits selecting and outputting one of an output signal from the digital/analog converter circuit and the low level signals applied to respective selector circuits in response to respective select signals applied to the select signal input terminals.

9. The variable delay circuit of claim 8 further comprising a delay circuit connected between the data signal input terminal and the input terminal of the inverter.

10. The variable delay circuit of claim 8 further comprising (n+1) transistors having different sizes and connected to respective input terminals of the NOR circuit.

11. The variable delay circuit of claim 1 further comprising:

a first power supply and a second power supply;
a first resistor having a trimmable variable resistance and connected between the first power supply and the first selector input terminal of the n selector circuits; and
a second resistor having a trimmable varying resistance and connected between the second power supply and the first selector input terminal of the n selector circuits.

12. A variable delay circuit for delaying an input signal by a variable delay time from a rising edge or a falling edge of the input signal to a rising edge or a falling edge of an output signal in a digital circuit, the variable delay circuit comprising:

a variable delay element comprising:
a data signal input terminal;
a first signal input terminal for receiving a low level signal;
n selector circuits (n is an integer larger than 1), each selector circuit having an output terminal, a first selector input terminal, a second selector input terminal connected to the data signal input terminal, and a third selector input terminal connected to the first signal input terminal for selecting and supplying to the output terminal one of a signal applied to the data signal input terminal and the low level signal applied to the first signal input terminal in response to a selection signal applied to the first selector input terminal; and a NOR circuit having an output terminal and (n+1)-input terminals respectively connected to the data signal input terminal and the output terminals of the n selector circuits;

(m−2) buffer circuits (m is an integer not less than 3) having input and output terminals, the buffer circuits being connected in series when m is at least 4, and connected to the output terminal of the NOR circuit; and a selector circuit having an output terminal and input terminals respectively connected to the data signal input terminal and the input terminals of the (m−2) buffer circuits for selecting and supplying to the output terminal one of a signal applied to the data input signal terminal, a signal output from the variable delay element, and an output signal from one of the buffer circuits.

13. A variable delay circuit for delaying an input signal by a variable delay time from a rising edge or a falling edge of the input signal to a rising edge or a falling edge of an output signal in a digital circuit, the variable delay circuit comprising:

(n−1) variable delay elements (n is an integer not less than 2), each variable delay element having an input terminal for receiving a data input signal and comprising:

a data signal input terminal;

a first signal input terminal for receiving a low level signal;

m selector circuits (m is an integer larger than 1), each selector circuit having an output terminal, a first selector input terminal, a second selector input terminal connected to the data signal input terminal, and a third selector input terminal connected to the first signal input terminal for selecting and supplying to the output terminal one of a signal applied to the data signal input terminal and the low level signal applied to the first signal input terminal in response to a selection signal applied to the first selector input terminal; and a NOR circuit having an output terminal and (m+1)-input terminals respectively connected to the data signal input terminal and the output terminals of the m selector circuits; and a selector circuit selecting and supplying to an output terminal one of the data input signal and output signals from the (n−1) variable delay elements.

14. A ring oscillator comprising:

an odd number of inverters connected in a ring;

n variable delay circuits (n is an integer greater than 1) having respective input and output terminals, connected in series, and inserted in the ring between at least two of the inverters, each variable delay circuit comprising:

a data signal input terminal;

a first signal input terminal for receiving a low level signal;

m selector circuits (m is an integer larger than 1), each selector circuit having an output terminal, a first selector input terminal, a second selector input terminal connected to the data signal input terminal, and a third selector input terminal connected to the first signal input terminal for selecting and supplying to the output terminal one of a signal applied to the data signal input terminal and the low level signal applied to the first signal input terminal in response to a selection signal applied to the first selector input terminal; and a NOR circuit having an output terminal and (m+1)-input terminals respectively connected to the data signal input terminal and the output terminals of the m selector circuits.

15. The ring oscillator of claim 14 where each of the NOR circuits includes an additional reset input terminal for receiving a reset signal.

16. A clock synchronous flip-flop circuit for operating synchronously with a clock signal comprising:

a variable delay circuit having an input terminal for receiving a data input signal, the variable delay circuit comprising:

a data signal input terminal;

a first signal input terminal for receiving a low level signal;

n selector circuits (n is an integer larger than 1), each selector circuit having an output terminal, a first selector input terminal, a second selector input terminal connected to the data signal input terminal, and a third selector input terminal connected to the first signal input terminal for selecting and supplying to the output terminal one of a signal applied to the data signal input terminal and the low level signal applied to the first signal input terminal in response to a selection signal applied to the first selector input terminal; and a NOR circuit having an output terminal as an output terminal of the variable delay circuit and (n+1)-input terminals respectively connected to the data signal input terminal and the output terminals of the n selector circuits; and a flip-flop having a first input terminal connected to the output terminal of the variable delay circuit and a second input terminal connected to a clock signal.

* * * * *